US012107127B2

(12) United States Patent
Kono et al.

(10) Patent No.: US 12,107,127 B2
(45) Date of Patent: Oct. 1, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Kono, Himeji Hyogo (JP); Teruyuki Ohashi, Kawasaki Kanagawa (JP); Takahiro Ogata, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 397 days.

(21) Appl. No.: 17/690,374

(22) Filed: Mar. 9, 2022

(65) Prior Publication Data

US 2023/0088612 A1    Mar. 23, 2023

(30) Foreign Application Priority Data

Sep. 22, 2021    (JP) ................................. 2021-154761

(51) Int. Cl.
*H01L 29/16*    (2006.01)
*H01L 29/08*    (2006.01)
(Continued)

(52) U.S. Cl.
CPC ...... *H01L 29/1608* (2013.01); *H01L 29/0878* (2013.01); *H01L 29/1095* (2013.01); *H01L 29/7802* (2013.01)

(58) Field of Classification Search
CPC ............. H01L 29/1608; H01L 29/0878; H01L 29/1095; H01L 29/7802; H01L 29/0623;
(Continued)

(56) References Cited

U.S. PATENT DOCUMENTS 9,786,778 B1 * 10/2017 Morizuka ........... H01L 29/1608
9,887,285 B1 *  2/2018 Oota ................... H01L 29/7805
(Continued)

FOREIGN PATENT DOCUMENTS

JP    2008-311261 A    12/2008
JP    2015-185616 A    10/2015
(Continued)

OTHER PUBLICATIONS

Notice of Reasons for Refusal mailed Jun. 4, 2024 in corresponding Japanese Patent Application No. 2021-154761, 12 pages (with Translation).

*Primary Examiner* — Victor A Mandala
(74) *Attorney, Agent, or Firm* — Kim & Stewart LLP

(57) ABSTRACT

A semiconductor device of embodiments includes: a first electrode; a second electrode; a gate electrode extending in a first direction; and a SiC layer. The SiC layer includes: a first conductive type first SiC region having a first region, a second region facing the gate electrode, and a third region in contact with the first electrode; a second conductive type second SiC region between the second region and the third region; a second conductive type third SiC region, the second region interposed between the second SiC region and the third SiC region; a second conductive type fourth SiC region, the third region interposed between the second SiC region and the fourth SiC region; a first conductive type fifth SiC region; a second conductive type sixth SiC region between the first region and the second SiC region; and a second conductive type seventh SiC region between the first region and the second SiC region and distant from the sixth SiC region in the first direction.

10 Claims, 28 Drawing Sheets

(51) Int. Cl.
*H01L 29/10* (2006.01)
*H01L 29/78* (2006.01)

(58) Field of Classification Search
CPC ............. H01L 29/0646; H01L 29/0696; H01L 29/7806
See application file for complete search history.

(56) References Cited

U.S. PATENT DOCUMENTS

| | | | | |
|---|---|---|---|---|
| 2013/0026559 | A1* | 1/2013 | Arthur | H01L 29/7802 257/329 |
| 2013/0240981 | A1* | 9/2013 | Hutzler | H01L 29/7827 438/268 |
| 2013/0344667 | A1* | 12/2013 | Qin | H01L 29/7813 438/270 |
| 2015/0084063 | A1* | 3/2015 | Van Brunt | H01L 29/872 257/77 |
| 2015/0270354 | A1 | 9/2015 | Shimizu et al. | |
| 2016/0181416 | A1* | 6/2016 | Weber | H01L 29/0634 257/330 |
| 2017/0271442 | A1* | 9/2017 | Uehara | H01L 29/0634 |
| 2018/0047855 | A1 | 2/2018 | Yasui et al. | |
| 2018/0083095 | A1* | 3/2018 | Kono | H01L 29/1095 |
| 2018/0204914 | A1* | 7/2018 | Treiber | H01L 29/407 |
| 2018/0212041 | A1* | 7/2018 | Dolny | H01L 29/66659 |
| 2018/0308936 | A1* | 10/2018 | Shimizu | H01L 29/1608 |
| 2020/0091295 | A1* | 3/2020 | Ohashi | H01L 29/36 |
| 2020/0219980 | A1* | 7/2020 | Shimizu | H01L 29/518 |
| 2020/0312998 | A1* | 10/2020 | Kaindl | H01L 29/0615 |
| 2022/0085170 | A1* | 3/2022 | Shimizu | H01L 29/66666 |
| 2022/0115532 | A1 | 4/2022 | Sun et al. | |
| 2023/0017518 | A1* | 1/2023 | Ohashi | H01L 29/1095 |

FOREIGN PATENT DOCUMENTS

| | | |
|---|---|---|
| JP | 2016-009712 A | 1/2016 |
| JP | 2016-015378 A | 1/2016 |
| JP | 6271813 B2 | 1/2018 |
| JP | 6632910 B2 | 1/2020 |
| JP | 2020-038944 A | 3/2020 |
| JP | 6666224 B2 | 3/2020 |
| WO | 2020/135313 A1 | 7/2020 |

* cited by examiner

FIG.15 CC' CROSS SECTION

SEMICONDUCTOR DEVICE

CROSS-REFERENCE TO RELATED APPLICATION

This application is based upon and claims the benefit of priority from Japanese Patent Application No. 2021-154761, filed on Sep. 22, 2021, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such characteristics, for example, it is possible to realize a metal oxide semiconductor field effect transistor (MOSFET) that has a high breakdown voltage and low loss and that can operate at high temperature.

A vertical MOSFET using silicon carbide has a pn junction diode as a built-in diode. For example, a MOSFET is used as a switching element connected to an inductive load. In this case, even when the MOSFET is in the off state, a reflux current can be made to flow by using a pn junction diode.

However, when a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET. For example, by providing a Schottky barrier diode (SBD) operating in a unipolar manner in the MOSFET as a built-in diode, it is possible to suppress the growth of a stacking fault in the silicon carbide layer.

A high surge voltage may be applied to the MOSFET momentarily beyond the steady state. When a high surge voltage is applied, a large surge current flows to generate heat, destroying the MOSFET. The maximum allowable peak current value ($I_{FSM}$) of the surge current allowed in the MOSFET is referred to as a surge current withstand capacity. In a MOSFET in which the SBD is provided, it is desired to improve the surge current withstand capacity from the viewpoint of improving reliability.

DETAILED DESCRIPTION

Figure 1:
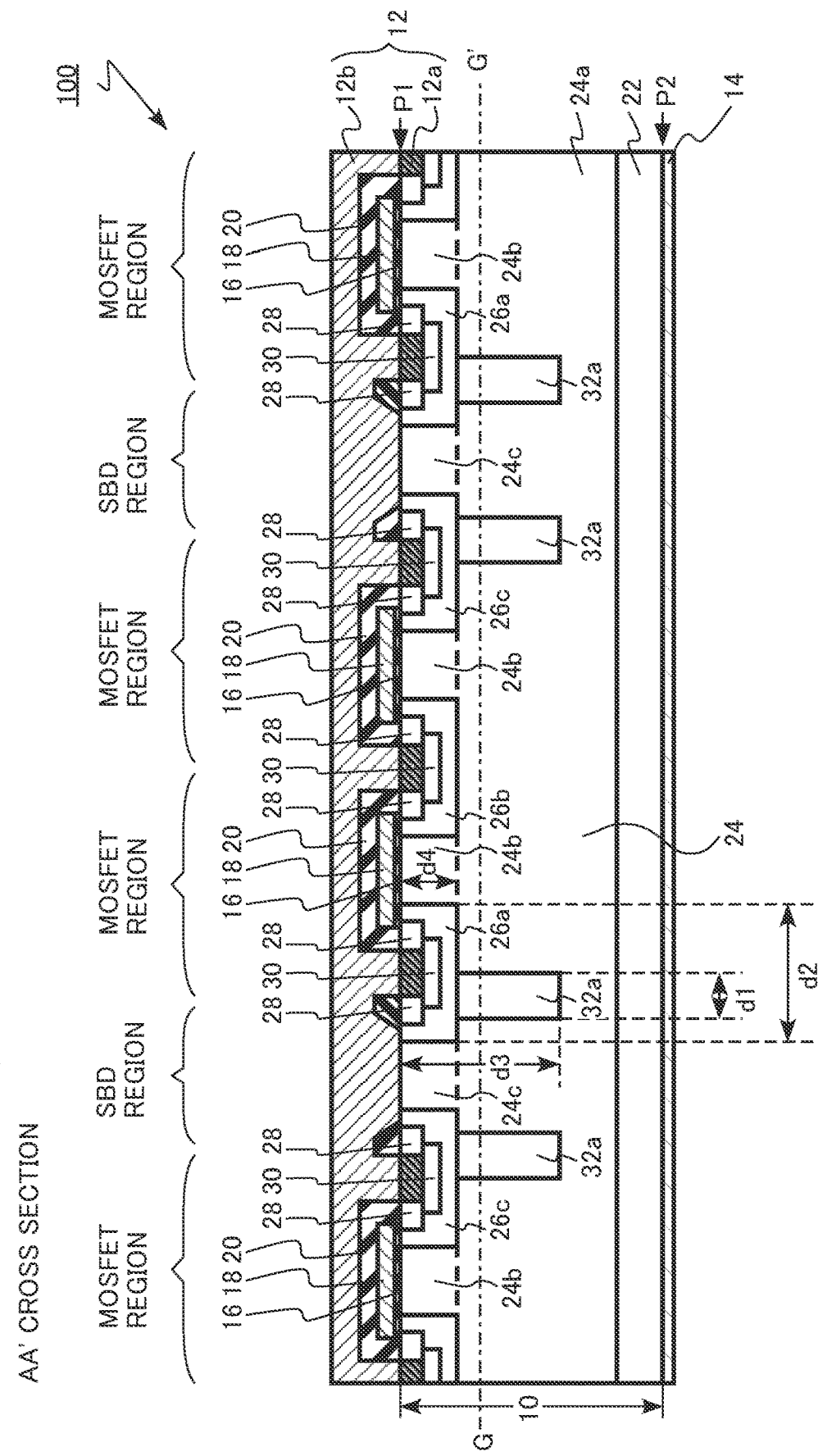
FIG. 1 is a schematic cross-sectional view of a semiconductor device of a first embodiment.

A semiconductor device of embodiments includes: a first electrode; a second electrode; a gate electrode extending in a first direction; a silicon carbide layer provided between the first electrode and the second electrode, having a first face parallel to the first direction on a side of the first electrode and a second face on a side of the second electrode, and including: a first silicon carbide region of a first conductive type having a first region, a second region and a third region, the second region provided between the first region and the first face, the second region being in contact with the first face, the second region facing the gate electrode, the third region provided between the first region and the first face, the third region being in contact with the first face, and the third region being in contact with the first electrode; a second silicon carbide region of a second conductive type provided between the first region and the first face, the second silicon carbide region disposed between the second region and the third region, the second silicon carbide region facing the gate electrode, and the second silicon carbide region electrically connected to the first electrode; a third silicon carbide region of a second conductive type provided between the first region and the first face, the third silicon carbide region facing the gate electrode, and the third silicon carbide region electrically connected to the first electrode, the second region being disposed between the second silicon carbide region and the third silicon carbide region; a fourth silicon carbide region of a second conductive type provided between the first region and the first face and electrically connected to the first electrode, the third region being disposed between the second silicon carbide region and the fourth silicon carbide region; a fifth silicon carbide region of a first conductive type provided between the second silicon carbide region and the first face and electrically connected to the first electrode; a sixth silicon carbide region of a second conductive type provided between the first region and the second silicon carbide region; and a seventh silicon carbide region of a second conductive type provided between the first region and the second silicon carbide region, and the seventh silicon carbide region being separated from the sixth silicon carbide region in the first direction; and a gate insulating layer provided between the gate electrode and the second silicon carbide region, the gate insulating layer provided between the gate electrode and the third silicon carbide region, and the gate insulating layer provided between the gate electrode and the second region.

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of $n^+$, n, $n^-$, $p^+$, p, and $p^-$, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

In addition, unless otherwise specified in this specification, the "impurity concentration" means a concentration when the impurity concentration of the opposite conductive type is compensated for. That is, the n-type impurity concentration in an n-type silicon carbide region means a concentration obtained by subtracting the concentration of p-type impurities from the concentration of n-type impurities. In addition, the p-type impurity concentration in a p-type silicon carbide region means a concentration obtained by subtracting the concentration of n-type impurities from the concentration of p-type impurities.

In addition, unless otherwise specified in this specification, the "impurity concentration in the silicon carbide region" is a maximum impurity concentration in the corresponding silicon carbide region.

The impurity concentration can be measured by, for example, time of flight-secondary ion mass spectrometry (TOF-SIMS). In addition, the relative high and low of the impurity concentration can be determined from, for example, the high and low of the carrier concentration obtained by scanning capacitance microscopy (SCM). In addition, the distance such as the depth and thickness of an impurity region can be calculated by, for example, the TOF-SIMS. In addition, the distance such as the depth, thickness, and width of an impurity region and a spacing between impurity regions can be calculated from, for example, a composite image of an SCM image and an atomic force microscope (AFM) image.

First Embodiment

A semiconductor device of a first embodiment includes: a first electrode; a second electrode; a gate electrode extending in a first direction; a silicon carbide layer provided between the first electrode and the second electrode, having a first face parallel to the first direction on a side of the first electrode and a second face on a side of the second electrode, and including: a first silicon carbide region of a first conductive type having a first region, a second region and a third region, the second region provided between the first region and the first face, the second region being in contact with the first face, the second region facing the gate electrode, the third region provided between the first region and the first face, the third region being in contact with the first face, and the third region being in contact with the first electrode; a second silicon carbide region of a second conductive type provided between the first region and the first face, the second silicon carbide region disposed between the second region and the third region, the second silicon carbide region facing the gate electrode, and the second silicon carbide region electrically connected to the first electrode; a third silicon carbide region of a second conductive type provided between the first region and the first face, the third silicon carbide region facing the gate electrode, and the third silicon carbide region electrically connected to the first electrode, the second region being disposed between the second silicon carbide region and the third silicon carbide region; a fourth silicon carbide region of a second conductive type provided between the first region and the first face and electrically connected to the first electrode, the third region being disposed between the second silicon carbide region and the fourth silicon carbide region; a fifth silicon carbide region of a first conductive type provided between the second silicon carbide region and the first face and electrically connected to the first electrode; a sixth silicon carbide region of a second conductive type provided between the first region and the second silicon carbide region; and a seventh silicon carbide region of a second conductive type provided between the first region and the second silicon carbide region, and the seventh silicon carbide region being separated from the sixth silicon carbide region in the first direction; and a gate insulating layer provided between the gate electrode and the second silicon carbide region, the gate insulating layer provided between the gate electrode and the third silicon carbide region, and the gate insulating layer provided between the gate electrode and the second region.

Figure 2:
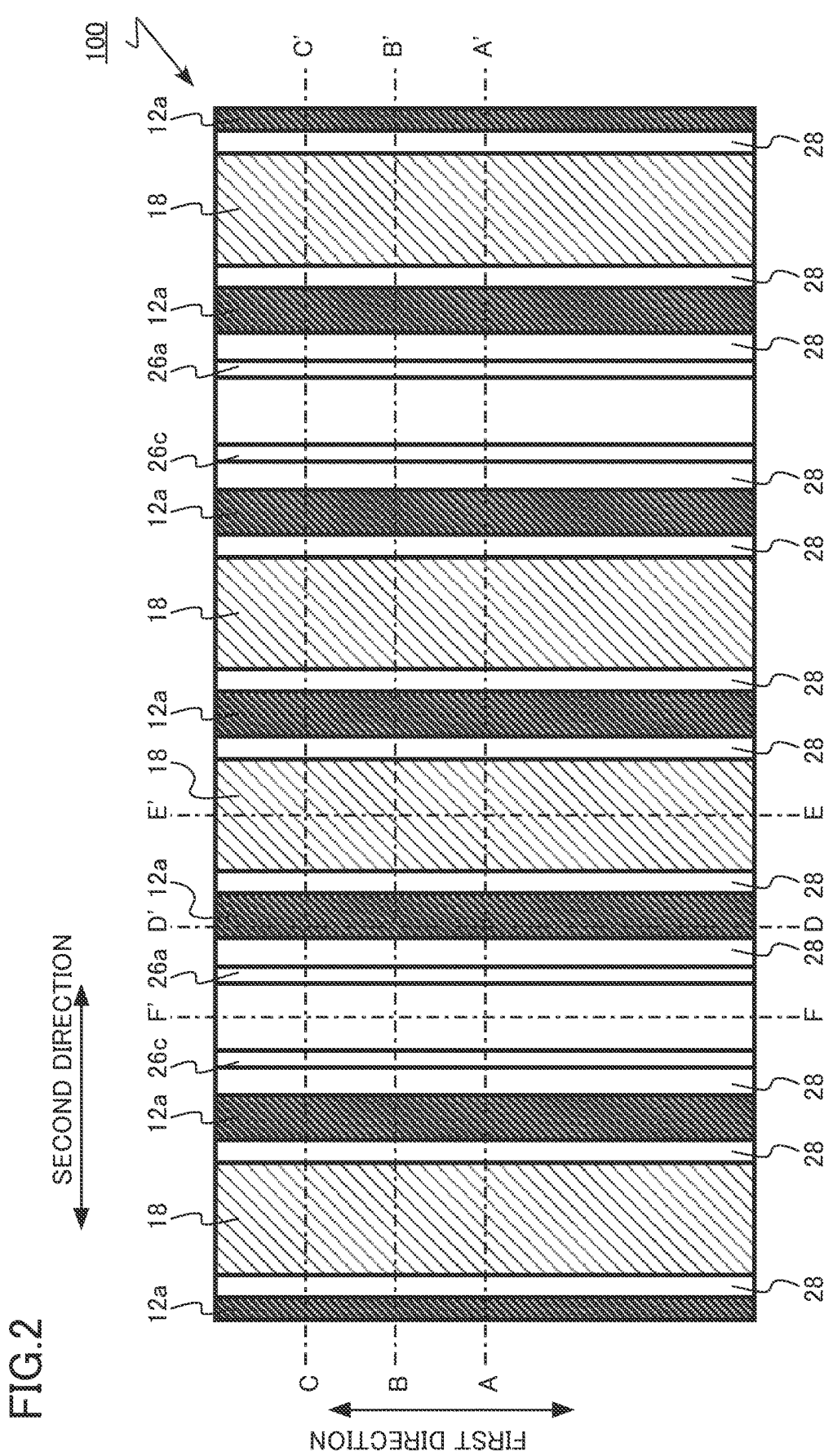
FIG. 2 is a schematic top view of the semiconductor device of the first embodiment.

FIG. 1 is a schematic cross-sectional view of the semiconductor device of the first embodiment. FIG. 2 is a schematic top view of the semiconductor device of the first embodiment. FIGS. 3 to 8 are schematic cross-sectional views of the semiconductor device of the first embodiment.

Figure 3:
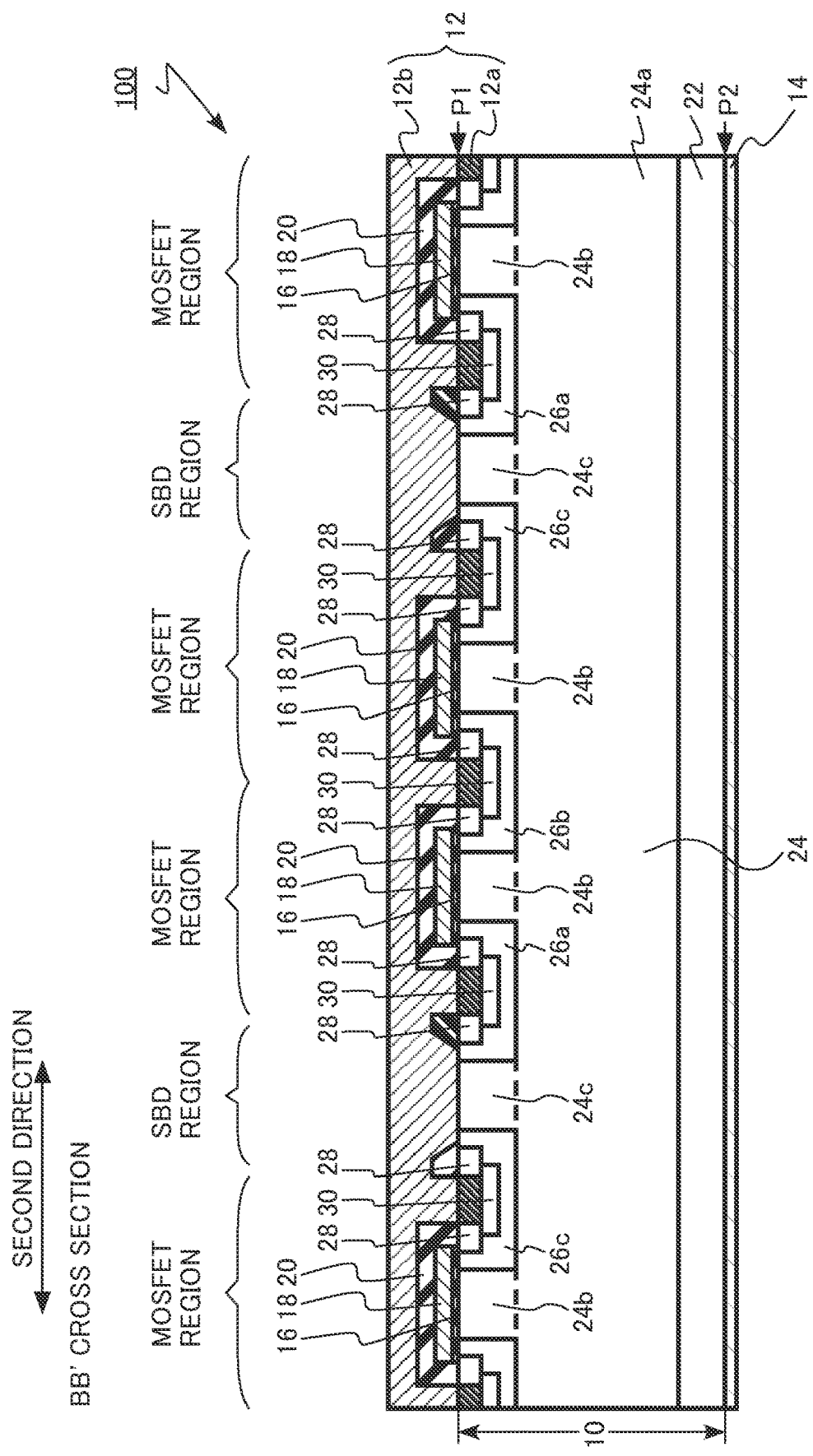
FIG. 3 is a schematic cross-sectional view of the semiconductor device of the first embodiment.
Figure 4:
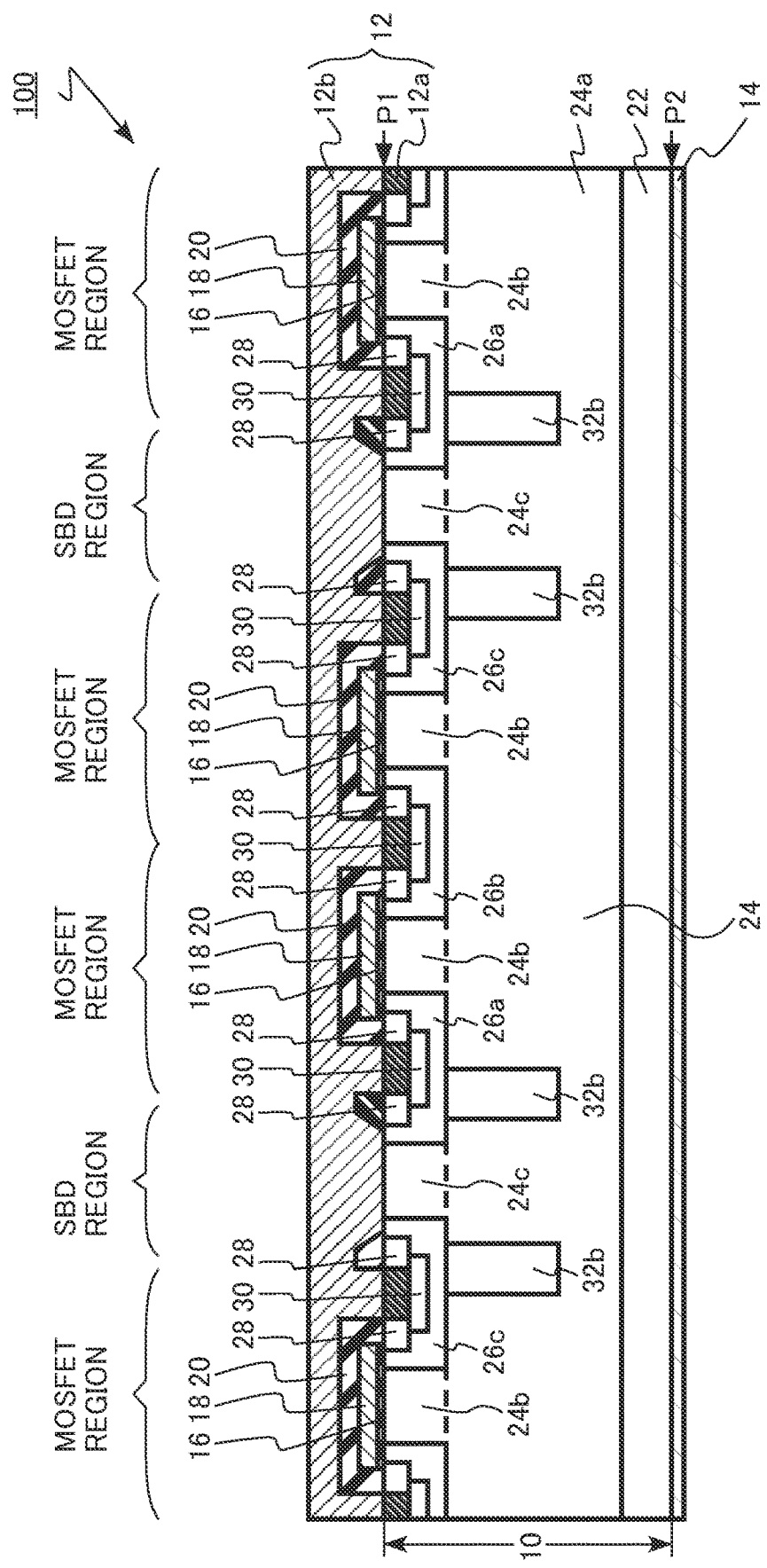
FIG. 4 is a schematic cross-sectional view of the semiconductor device of the first embodiment.
Figure 5:
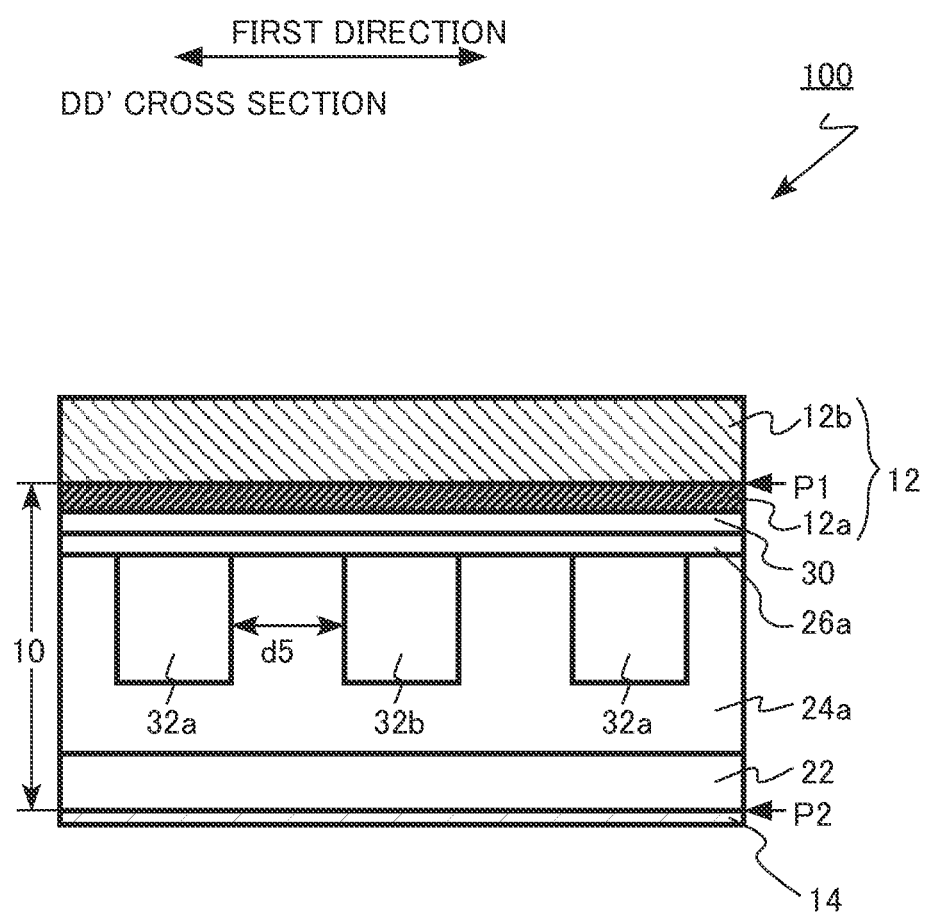
FIG. 5 is a schematic cross-sectional view of the semiconductor device of the first embodiment.
Figure 6:
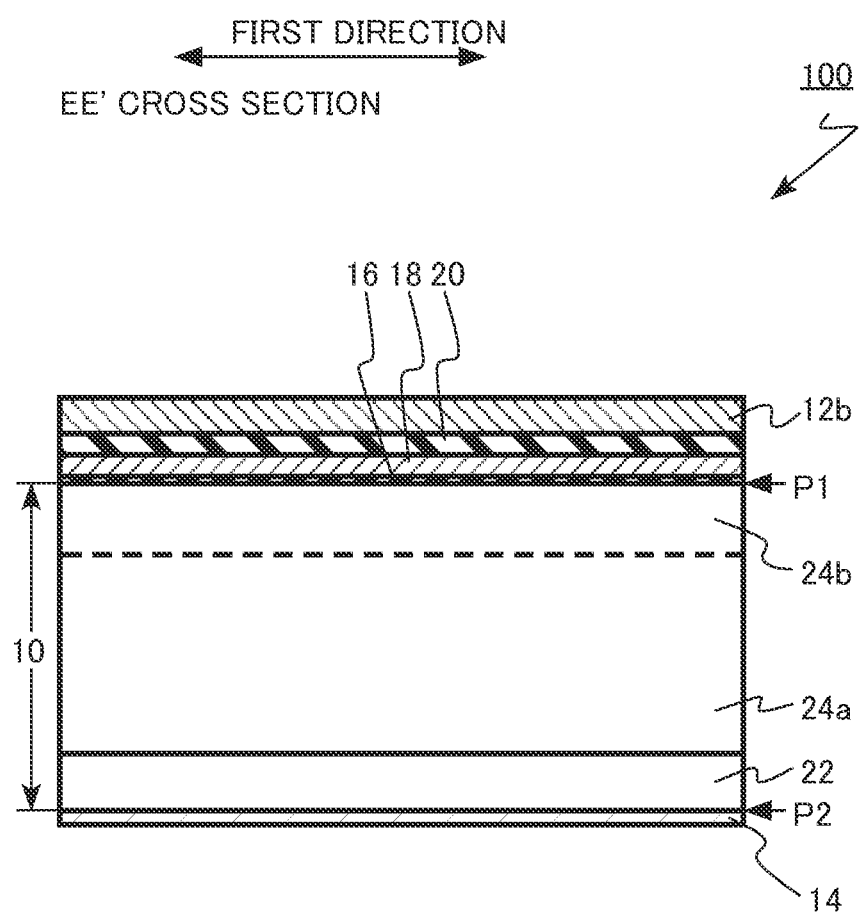
FIG. 6 is a schematic cross-sectional view of the semiconductor device of the first embodiment.
Figure 7:
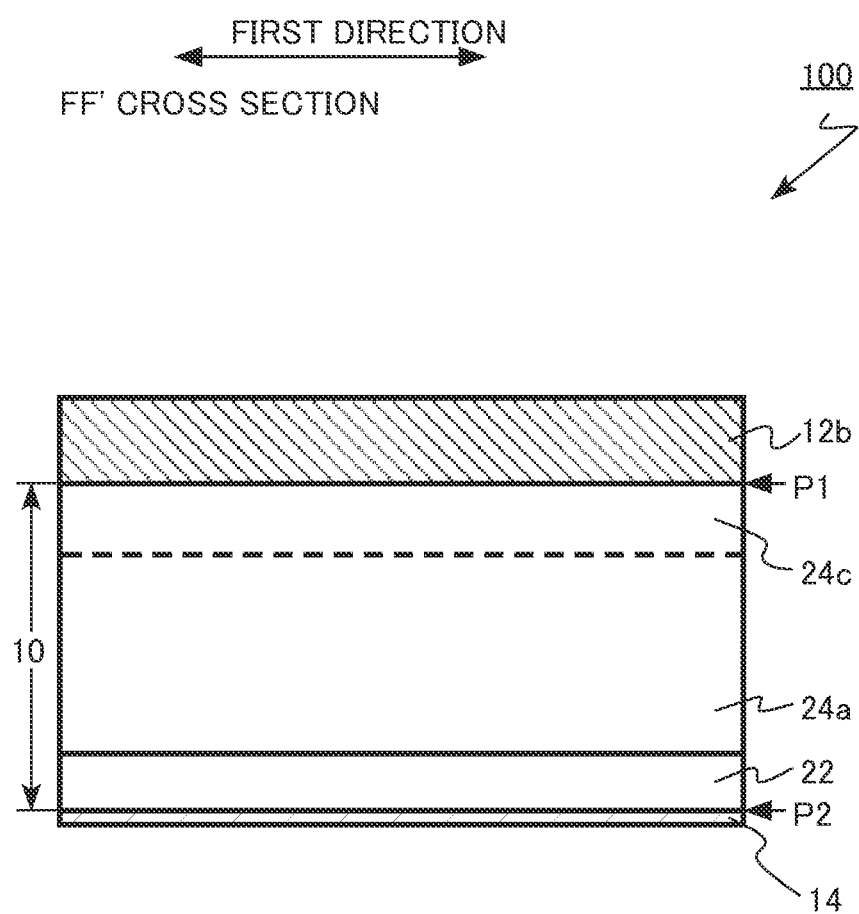
FIG. 7 is a schematic cross-sectional view of the semiconductor device of the first embodiment.
Figure 8:
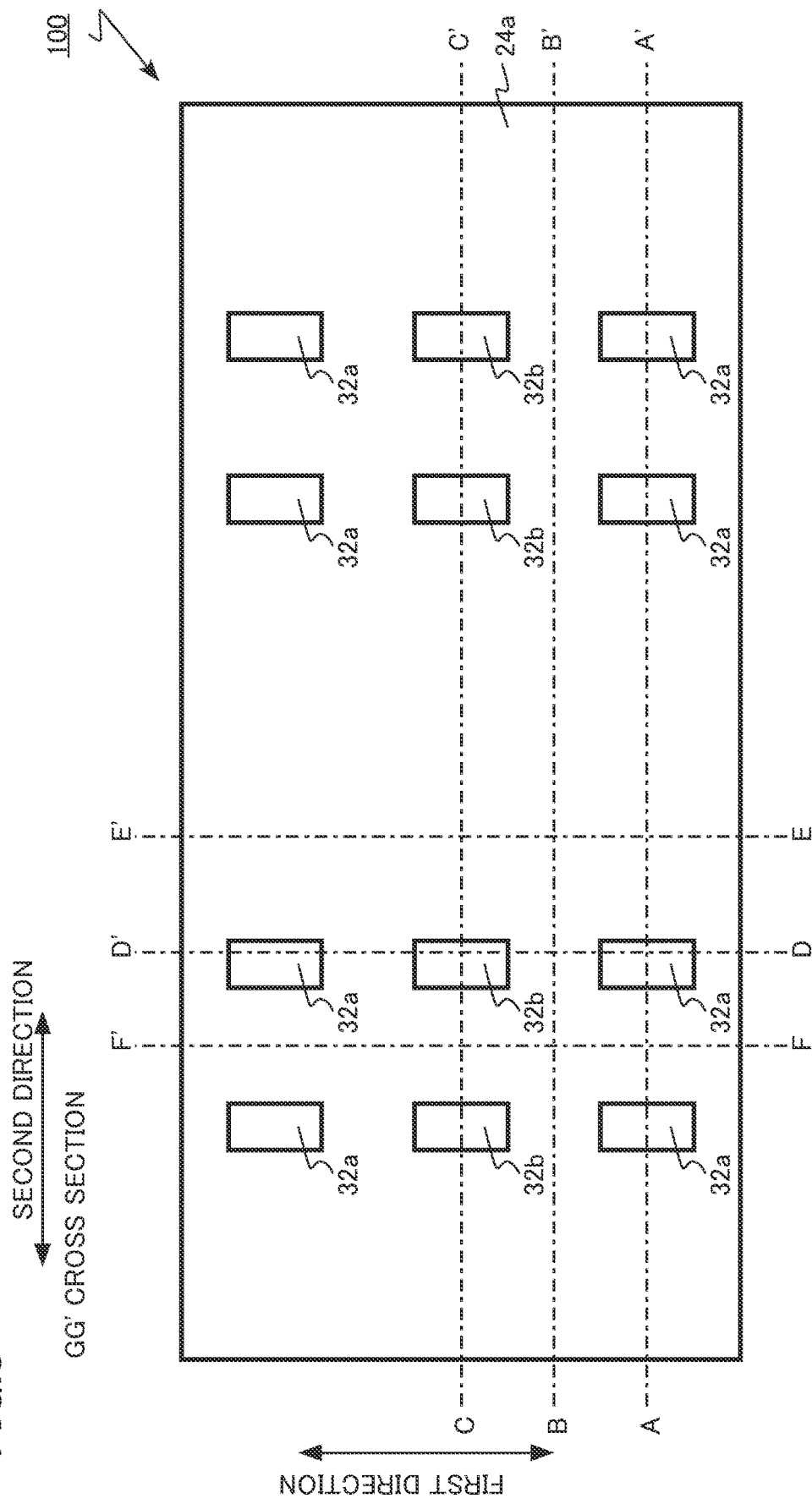
FIG. 8 is a schematic cross-sectional view of the semiconductor device of the first embodiment.

FIG. 1 is a cross-sectional view taken along the line AA' of FIG. 2. FIG. 2 is a diagram showing a layout pattern of silicon carbide regions and electrodes on the surface of a silicon carbide layer. FIG. 2 shows a state in which a first electrode and an interlayer insulating layer are removed. FIG. 3 is a cross-sectional view taken along the line BB' of FIG. 2. FIG. 4 is a cross-sectional view taken along the line CC' of FIG. 2. FIG. 5 is a cross-sectional view taken along the line DD' of FIG. 2. FIG. 6 is a cross-sectional view taken along the line EE' of FIG. 2. FIG. 7 is a cross-sectional view taken along the line FF' of FIG. 2. FIG. 8 is a cross-sectional view taken along the line GG' of FIG. 1.

The semiconductor device of the first embodiment is a planar gate type vertical MOSFET 100 using silicon carbide. The MOSFET 100 of the first embodiment is, for example, a double implantation MOSFET (DIMOSFET) in which a body region and a source region are formed by ion implantation. In addition, the MOSFET 100 of the first embodiment includes an SBD as a built-in diode.

Hereinafter, a case where the first conductive type is n-type and the second conductive type is p-type will be described as an example. The MOSFET 100 is a vertical re-channel MOSFET having electrons as carriers.

The MOSFET 100 includes a silicon carbide layer 10, a source electrode 12 (first electrode), a drain electrode 14 (second electrode), a gate insulating layer 16, a gate electrode 18, and an interlayer insulating layer 20. The MOSFET 100 includes a plurality of MOSFET regions and a plurality of SBD regions.

The silicon carbide layer 10 includes an n$^+$-type drain region 22, an n$^-$-type drift region 24 (first silicon carbide region), a p-type body region 26, an n$^+$-type source region 28 (fifth silicon carbide region), a p$^+$-type body contact region 30 (eighth silicon carbide region), and a p-type pillar region 32.

The p-type body region 26 includes a first body region of p-type 26a (second silicon carbide region), a second body region of p-type 26b (third silicon carbide region), and a third body region of p-type 26c (fourth silicon carbide region). The p-type pillar region 32 includes a first pillar region of p-type 32a (sixth silicon carbide region) and a second pillar region of p-type 32b (seventh silicon carbide region). The drift region 24 has a lower region 24a, a JFET region 24b (first region), and a JBS region 24c (second region).

The source electrode 12 is an example of the first electrode. The drain electrode 14 is an example of the second electrode. The drift region 24 is an example of the first silicon carbide region. The first body region 26a is an example of the second silicon carbide region. The second body region 26b is an example of the third silicon carbide region. The third body region 26c is an example of the fourth silicon carbide region. The source region 28 is an example of the fifth silicon carbide region. The body contact region 30 is an example of the eighth silicon carbide region. The first pillar region 32a is an example of the sixth silicon carbide region. The second pillar region 32b is an example of the seventh silicon carbide region.

The silicon carbide layer 10 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("P1" in FIG. 1) and a second face ("P2" in FIG. 1). Hereinafter, the first face P1 may be referred to as a surface, and the second face P2 may be referred to as a back surface. The first face P1 is disposed on the source electrode 12 side of the silicon carbide layer 10. In addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

As shown in FIG. 1, the MOSFET 100 includes a plurality of MOSFET regions and a plurality of SBD regions. A MOSFET is formed in each MOSFET region. An SBD is formed in each SBD region.

The MOSFET region extends in the first direction. The MOSFET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 100, the ratio between the number of MOSFET regions and the number of SBD regions is 2:1.

The ratio between the number of MOSFET regions and the number of SBD regions is not limited to 2:1. For example, the ratio between the number of MOSFET regions and the number of SBD regions may be 1:1 or 3:1 or any other ratio.

The n$^+$-type drain region 22 is provided on the back surface side of the silicon carbide layer 10. The drain region 22 contains, for example, nitrogen (N) as an n-type impurity. The n-type impurity concentration in the drain region 22 is equal to or more than $1 \times 10^{18}$ cm$^{-3}$ and equal to or less than $1 \times 10^{21}$ cm$^{-3}$, for example.

The n$^-$-type drift region 24 is provided between the drain region 22 and the first face P1. The n$^-$-type drift region 24 is provided between the source electrode 12 and the drain electrode 14. The n$^-$-type drift region 24 is provided between the gate electrode 18 and the drain electrode 14.

The n$^-$-type drift region 24 is provided on the drain region 22. The drift region 24 contains, for example, nitrogen (N) as an n-type impurity. The n-type impurity concentration in the drift region 24 is lower than the n-type impurity concentration in the drain region 22. The n-type impurity concentration in the drift region 24 is equal to or more than $4 \times 10^{14}$ cm$^{-3}$ and equal to or less than $1 \times 10^{17}$ cm$^{-3}$, for example. The thickness of the drift region 24 is equal to or more than 5 μm and equal to or less than 150 μm, for example.

The n$^-$-type drift region 24 has the lower region 24a, the JFET region 24b, and the JBS region 24c. In addition, JBS is an abbreviation for Junction Barrier Schottky.

The JFET region 24b is provided between the lower region 24a and the first face P1. The JFET region 24b is in contact with the first face P1. The JFET region 24b is provided between two adjacent body regions. For example, the JFET region 24b is provided between the first body region 26a and the second body region 26b.

The JFET region 24b extends in the first direction. The JFET region 24b faces the gate electrode 18 with the gate insulating layer 16 interposed therebetween.

The JFET region 24b functions as a current path for the MOSFET 100. The n-type impurity concentration in the JFET region 24b is higher than, for example, the n-type impurity concentration in the lower region 24a. The n-type impurity concentration in the JFET region 24b is equal to or more than $5 \times 10^{16}$ cm$^{-3}$ and equal to or less than $2 \times 10^{17}$ cm$^{-3}$, for example.

The JBS region 24c is provided between the lower region 24a and the first face P1. The JBS region 24c is in contact with the first face P1. The JBS region 24c is provided between two adjacent body regions. For example, the JBS region 24c is provided between the first body region 26a and the third body region 26c.

The JBS region 24c extends in the first direction. The JBS region 24c is in contact with the source electrode 12.

The JBS region 24c is an impurity region on the cathode side of the SBD. The JBS region 24c has a function of reducing the electric field at the Schottky interface. The n-type impurity concentration in the JBS region 24c is higher than, for example, the n-type impurity concentration in the lower region 24a. The n-type impurity concentration in the JBS region 24c is equal to or more than $5 \times 10^{16}$ cm$^{-3}$ and equal to or less than $2 \times 10^{17}$ cm$^{-3}$, for example.

The p-type body region 26 is provided between the drift region 24 and the first face P1. The body region 26 extends in the first direction. The body region 26 functions as a channel region of the MOSFET 100.

The body region 26 contains, for example, aluminum (Al) as a p-type impurity. The p-type impurity concentration in the body region 26 is equal to or more than $5 \times 10^{17}$ cm$^{-3}$ and equal to or less than $5 \times 10^{19}$ cm$^{-3}$, for example.

The depth of the body region 26 is equal to or more than 0.5 μm and equal to or less than 1.0 μm, for example.

The body region 26 is electrically connected to the source electrode 12. The body region 26 is fixed to the electric potential of the source electrode 12.

A part of the body region 26 is in contact with the first face P1. A part of the body region 26 faces the gate electrode 18. A part of the body region 26 becomes a channel region of the MOSFET 100. The gate insulating layer 16 is interposed between a part of the body region 26 and the gate electrode 18.

The first body region 26a and the second body region 26b are separated from each other in the second direction. The first body region 26a and the second body region 26b are adjacent to each other in the second direction.

The first body region 26a and the third body region 26c are separated from each other in the second direction. The first body region 26a and the third body region 26c are adjacent to each other in the second direction.

The JFET region 24b is provided between the first body region 26a and the second body region 26b. The JBS region 24c is provided between the second body region 26b and the third body region 26c. The first body region 26a is interposed between the JFET region 24b and the JBS region 24c.

The n$^+$-type source region 28 is provided between the body region 26 and the first face P1. For example, the source region 28 is provided between the first body region 26a and the first face P1. The source region 28 extends in the first direction.

The source region 28 contains, for example, phosphorus (P) or nitrogen (N) as an n-type impurity. The n-type impurity concentration in the source region 28 is higher than the n-type impurity concentration in the drift region 24.

The n-type impurity concentration in the source region 28 is equal to or more than $1 \times 10^{19}$ cm$^{-3}$ and equal to or less than $1 \times 10^{21}$ cm$^{-3}$, for example. The depth of the source region 28 is smaller than the depth of the body region 26. The depth of the source region 28 is equal to or more than 0.05 μm and equal to or less than 0.2 μm, for example.

The source region 28 is in contact with the source electrode 12. The source region 28 is electrically connected to the source electrode 12. The contact between the source region 28 and the source electrode 12 is, for example, an ohmic contact. The source region 28 is fixed to the electric potential of the source electrode 12.

The p$^+$-type body contact region 30 is provided between the body region 26 and the first face P1. The body contact region 30 is provided between the body region 26 and the source electrode 12. The body contact region 30 extends in the first direction.

The p-type impurity concentration in the body contact region 30 is higher than the p-type impurity concentration in the body region 26.

The body contact region 30 contains, for example, aluminum (Al) as a p-type impurity. The p-type impurity concentration in the body contact region 30 is equal to or more than $1 \times 10^{19}$ cm$^{-3}$ and equal to or less than $1 \times 10^{21}$ cm$^{-3}$, for example.

The depth of the body contact region 30 is equal to or more than 0.3 μm and equal to or less than 0.6 μm, for example.

The body contact region 30 is in contact with the source electrode 12. The body contact region 30 is electrically connected to the source electrode 12. The contact between the body contact region 30 and the source electrode 12 is, for example, an ohmic contact. The body contact region 30 is fixed to the electric potential of the source electrode 12.

The pillar region 32 is provided between the drift region 24 and the body region 26. The pillar region 32 is provided between the lower region 24a and the body region 26.

For example, the first pillar region of p-type 32a is provided between the drift region 24 and the first body region 26a. The first pillar region 32a is provided between the lower region 24a and the first body region 26a.

For example, the second pillar region of p-type 32b is provided between the drift region 24 and the first body region 26a. The second pillar region 32b is provided between the lower region 24a and the first body region 26a.

The pillar region 32 is surrounded by, for example, the drift region 24. The pillar region 32 is surrounded by, for example, the lower region 24a.

For example, the pillar region 32 is repeatedly arranged in the first direction with the drift region 24 interposed therebetween. In addition, for example, the pillar region 32 is repeatedly arranged in the second direction with the drift region 24 interposed therebetween.

The second pillar region 32b is provided so as to be separated from the first pillar region 32a in the first direction.

The pillar region 32 is in contact with the body region 26. For example, the first pillar region 32a is in contact with the first body region 26a. For example, the second pillar region 32b is in contact with the first body region 26a.

The length of the pillar region 32 in the second direction is smaller than the length of the body region 26 in the second direction. For example, the length (d1 in FIG. 1) of the first pillar region 32a in the second direction is smaller than the length (d2 in FIG. 1) of the first body region 26a in the second direction. For example, the length of the second pillar region 32b in the second direction is smaller than the length (d2 in FIG. 1) of the first body region 26a in the second direction.

The length of the pillar region 32 in the first direction is equal to or less than twice the length of the body region 26 in the second direction, for example. For example, the length of the first pillar region 32a in the first direction is equal to or less than twice the length (d2 in FIG. 1) of the first body region 26a in the second direction. For example, the length of the second pillar region 32b in the first direction is equal to or less than twice the length (d2 in FIG. 1) of the first body region 26a in the second direction.

The depth of the pillar region 32 is equal to or more than 1.5 times the depth of the body region, for example. For example, the depth (d3 in FIG. 1) of the first pillar region 32a is equal to or more than twice the depth (d4 in FIG. 1) of the first body region 26a.

The depth of the pillar region 32 is equal to or more than 1.0 μm and equal to or less than 2.0 μm, for example.

The distance between the pillar region 32 and the JBS region 24c in the second direction is smaller than the distance between the pillar region 32 and the JFET region 24b in the second direction. For example, the distance between the first pillar region 32a and the JBS region 24c in the second direction is smaller than the distance between the first pillar region 32a and the JFET region 24b in the second direction.

The distance between the two pillar regions 32 adjacent to each other in the first direction is equal to or less than the length of the body region 26 in the second direction, for example. For example, the distance (d5 in FIG. 5) between the first pillar region 32a and the second pillar region 32b is equal to or less than the length (d2 in FIG. 1) of the first body region 26a in the second direction.

The distance between the two pillar regions 32 adjacent to each other in the first direction is equal to or more than half the width of the JBS region 24c in the second direction, for example. For example, the distance (d5 in FIG. 5) between the first pillar region 32a and the second pillar region 32b is equal to or more than half the width of the JBS region 24c in the second direction.

The pillar region 32 contains, for example, aluminum (Al) as a p-type impurity. The p-type impurity concentration in the pillar region 32 is equal to or more than $1 \times 10^{17}$ cm$^{-3}$ and equal to or less than $1 \times 10^{19}$ cm$^{-3}$, for example. The p-type impurity concentration in the pillar region 32 is lower than, for example, the p-type impurity concentration in the body region 26.

The pillar region 32 is electrically connected to, for example, the body region 26. The pillar region 32 is electrically connected to, for example, the source electrode 12. The pillar region 32 is fixed to the electric potential of the source electrode 12.

The gate electrode 18 is provided on the first face P1 side of the silicon carbide layer 10. The gate electrode 18 extends in the first direction. A plurality of gate electrodes 18 are arranged in parallel with each other in the second direction.

The gate electrode 18 is a conductive layer. The gate electrode 18 is, for example, polycrystalline silicon containing p-type impurities or n-type impurities.

The gate electrode 18 faces the body region 26. The gate electrode 18 faces the JFET region 24b.

The gate insulating layer 16 is provided between the gate electrode 18 and the body region 26. For example, the gate insulating layer 16 is provided between the gate electrode 18 and the first body region 26a, between the gate electrode 18 and the second body region 26b, and between the gate electrode 18 and the third body region 26c. The gate insulating layer 16 is provided between the gate electrode 18 and the JFET region 24b. The gate insulating layer 16 is provided between the gate electrode 18 and the source region 28.

The gate insulating layer 16 is, for example, silicon oxide. For example, a high-k insulating material (insulating material with a high dielectric constant) can be applied to the gate insulating layer 16.

The interlayer insulating layer 20 is provided on the gate electrode 18 and the silicon carbide layer 10. The interlayer insulating layer 20 is, for example, silicon oxide.

The source electrode 12 is in contact with the silicon carbide layer 10. The source electrode 12 is in contact with the source region 28. The source electrode 12 is in contact with the body contact region 30. The source electrode 12 is in contact with the JBS region 24c.

The source electrode 12 has, for example, a silicide layer 12a and a metal layer 12b. The silicide layer 12a is provided between the silicon carbide layer 10 and the metal layer 12b. The silicide layer 12a extends in the first direction.

The silicide layer 12a is in contact with the source region 28. The silicide layer 12a is in contact with the body contact region 30.

The source electrode 12 functions as an anode of the SBD.

The silicide layer 12a of the source electrode 12 contains silicide. The silicide layer 12a is, for example, nickel silicide or titanium silicide.

The contact between the source electrode 12 and the source region 28 becomes an ohmic contact by providing the silicide layer 12a. The contact between the source electrode 12 and the body contact region 30 becomes an ohmic contact by providing the silicide layer 12a.

The metal layer 12b of the source electrode 12 contains metal. The metal layer 12b has, for example, a stacked structure of titanium (Ti) and aluminum (Al).

The contact between the metal layer 12b of the source electrode 12 and the JBS region 24c is a Schottky contact.

The drain electrode 14 is provided on the back surface of the silicon carbide layer 10. The drain electrode 14 is in contact with the drain region 22.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

When the MOSFET 100 is in the on state, a current flows from the drain electrode 14 to the source electrode 12 through channels formed in the drain region 22, the lower region 24a, the JFET region 24b, and the body region 26 and the source region 28.

When a forward bias is applied to the SBD region, a current flows from the source electrode 12 to the drain electrode 14 through the JBS region 24c, the lower region 24a, and the drain region 22.

Next, the function and effect of the MOSFET 100 of the first embodiment will be described.

Figure 9:
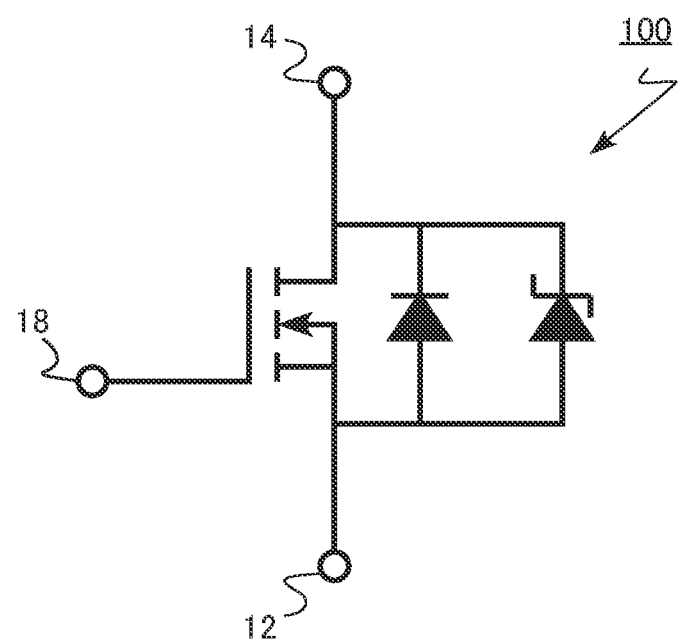
FIG. 9 is an equivalent circuit diagram of the semiconductor device of the first embodiment.

FIG. 9 is an equivalent circuit diagram of the semiconductor device of the first embodiment. In the MOSFET 100, between the source electrode 12 and the drain electrode 14, a pn diode and an SBD are connected as built-in diodes in parallel with a transistor. The body region 26 is an impurity region on the anode side of the pn junction diode, and the drift region 24 is an impurity region on the cathode side of the pn junction diode. In addition, the source electrode 12 is the anode of the SBD, and the JBS region 24c is an impurity region on the cathode side of the SBD.

For example, a case where the MOSFET 100 is used as a switching element connected to an inductive load is considered. When the MOSFET 100 is turned off, a voltage that is positive with respect to the drain electrode 14 may be applied to the source electrode 12 due to an induced current caused by an inductive load. In this case, a forward current flows through the built-in diode. This state is also referred to as a reverse conduction state.

If the MOSFET does not include an SBD, a forward current flows through the pn junction diode. The pn junction diode operates in a bipolar manner. When a reflux current is made to flow by using a pn junction diode that operates in a bipolar manner, if there is a basal plane dislocation (BPD) in the silicon carbide layer due to the recombination energy of the carriers, a stacking fault may grow. When the stacking fault grows in the silicon carbide layer, there arises a problem that the on-resistance of the MOSFET increases. Increasing the on-resistance of the MOSFET leads to a reduction in the reliability of the MOSFET.

The MOSFET 100 includes an SBD. A forward voltage (Vf) at which a forward current starts to flow through the SBD is lower than a forward voltage (Vf) of the pn junction diode. Therefore, a forward current flows through the SBD prior to the pn junction diode.

The SBD operates in a unipolar manner. Therefore, even if a forward current flows, no stacking fault grows in the silicon carbide layer 10 due to the recombination energy of the carriers. Therefore, the increase in the on-resistance of the MOSFET 100 is suppressed. As a result, the reliability of the MOSFET 100 is improved.

Here, a high surge voltage that momentarily makes the source electrode 12 positive may be applied between the source electrode and the drain electrode of the MOSFET beyond the steady state. When a high surge voltage is applied, a large surge current flows through the MOSFET, and the MOSFET may be destroyed by heat generation.

The maximum allowable peak current value ($I_{FSM}$) of the surge current allowed in the MOSFET is referred to as a surge current withstand capacity. In a MOSFET in which the SBD is provided, it is desired to improve the surge current withstand capacity from the viewpoint of improving reliability.

Figure 10:
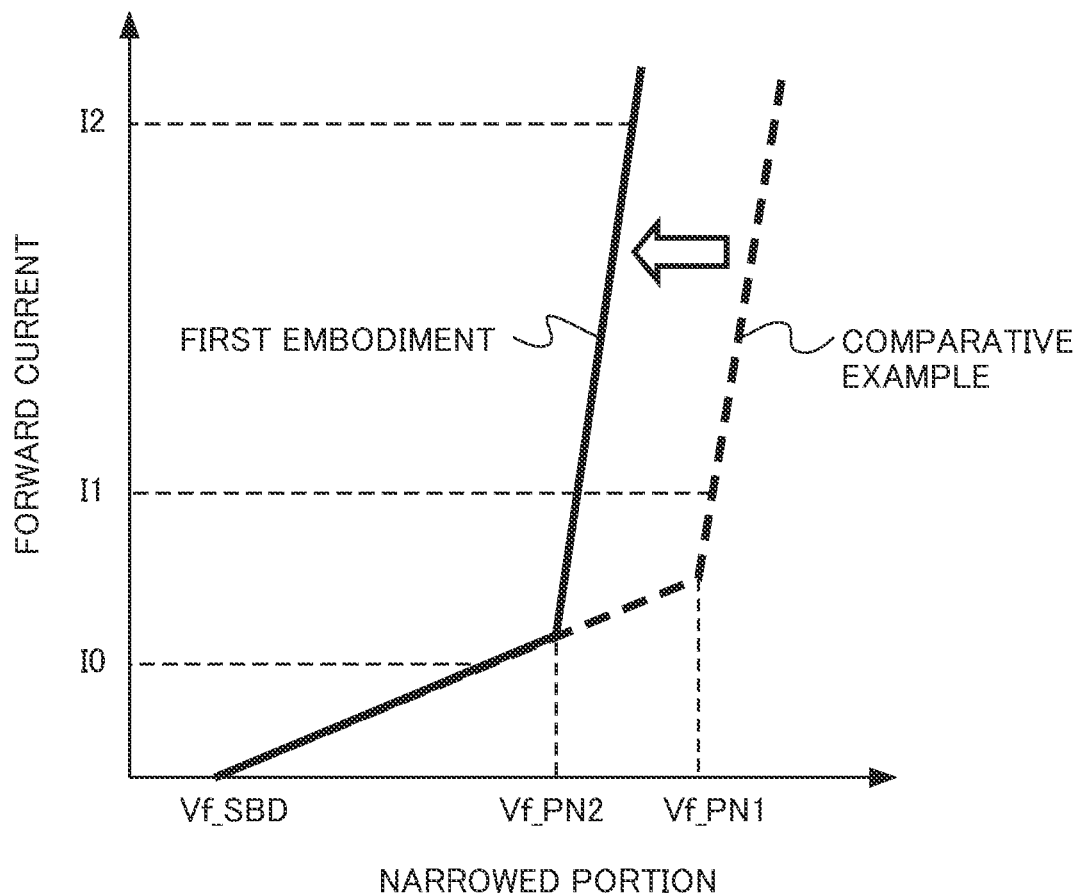
FIG. 10 is an explanatory diagram of the function and effect of the semiconductor device of the first embodiment.

FIG. 10 is an explanatory diagram of the function and effect of the semiconductor device of the first embodiment. FIG. 10 shows the characteristics of current that flows when a voltage that makes the source electrode positive is applied to the MOSFET. In FIG. 10, in order to show the characteristics of the diode, the applied voltage is referred to as a forward voltage, and the flowing current is referred to as a forward current. The surge current is a forward current.

The dotted line shows the current-voltage characteristics of the MOSFET in a comparative example. In addition, the solid line shows the current-voltage characteristics of the MOSFET 100 of the first embodiment. The MOSFET of the comparative example is different from the MOSFET 100 of the first embodiment in that the pillar region 32 is not provided.

Figure 11:
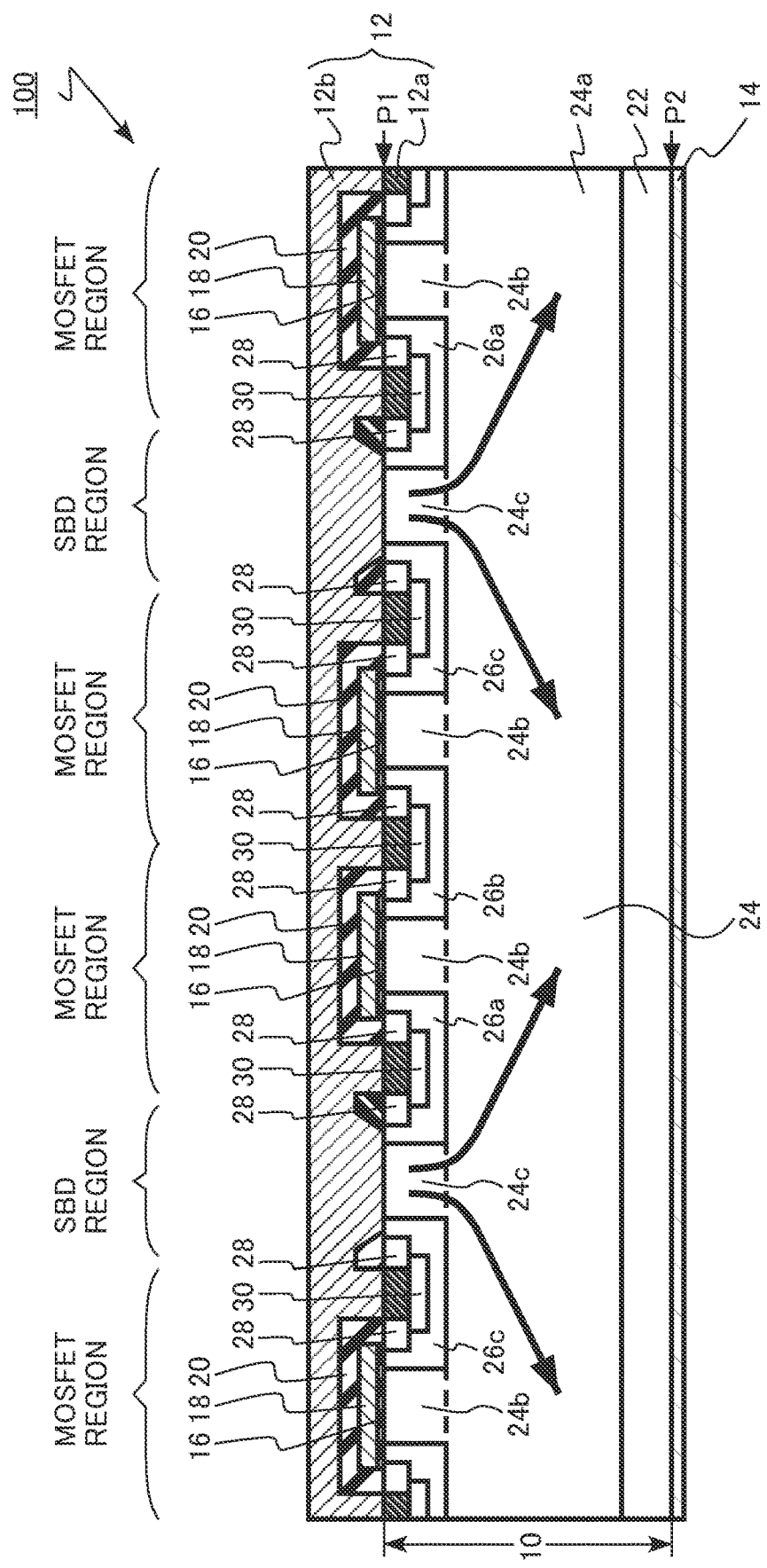
FIG. 11 is an explanatory diagram of the function and effect of the semiconductor device of the first embodiment.
Figure 12:
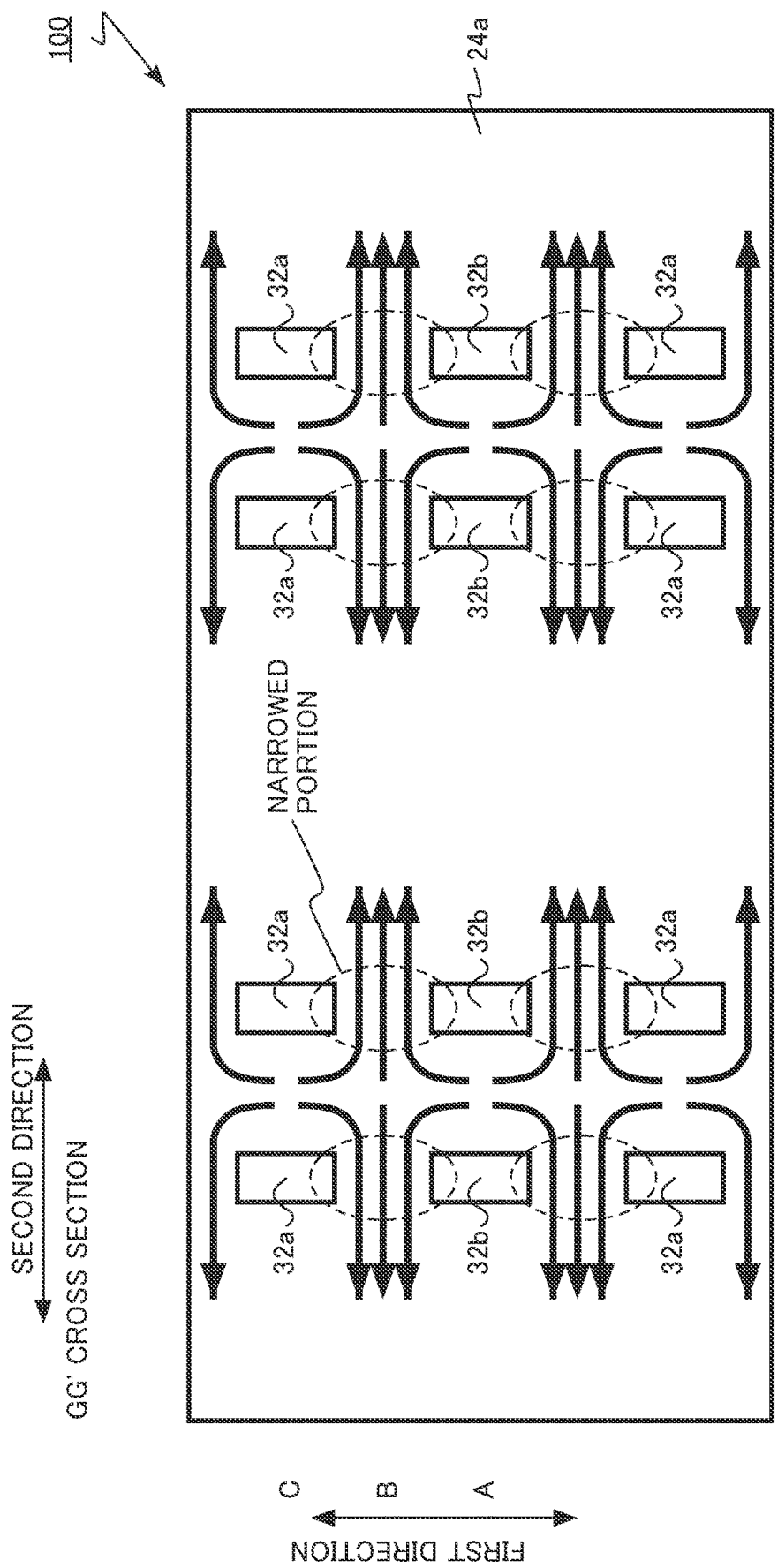
FIG. 12 is an explanatory diagram of the function and effect of the semiconductor device of the first embodiment.

FIGS. 11 and 12 are explanatory diagrams of the function and effect of the semiconductor device of the first embodiment. FIGS. 11 and 12 show, by arrows, the current path of the forward current that flows when a voltage that makes the source electrode positive is applied to the MOSFET 100 of the first embodiment.

FIG. 11 is a cross-sectional view taken along the line BB' of FIG. 2. FIG. 12 is a cross-sectional view taken along the line GG' of FIG. 1.

As shown in FIG. 11, a forward current flowing from the source electrode 12 to the drain electrode 14 through the JBS region 24c spreads laterally toward the body region 26 in the drift region 24. Since the forward current flows through the lower portion of the body region 26, the voltage applied to the pn junction is effectively reduced. Therefore, a forward voltage (Vf_PN) at which the pn junction diode starts its bipolar operation increases. As a result, it is possible to suppress the operation of the pn junction diode when a reflux current (I0 in FIG. 10) flows in a steady state in the MOSFET 100. This function is the same for the MOSFET of the comparative example in which the pillar region 32 is not provided.

However, if the forward voltage (Vf_PN) at which the pn junction diode starts its bipolar operation is too high, the surge current withstand capacity may be reduced when a high surge voltage is applied beyond the steady state.

For example, in the MOSFET of the comparative example, the forward voltage is Vf_PN1. For example, in the MOSFET of the comparative example, a surge current I1 is the maximum allowable peak current value. The MOSFET of the comparative example is destroyed by heat generation when the surge current exceeds the surge current I1.

The MOSFET 100 of the first embodiment includes the pillar region 32. Therefore, as shown in FIG. 12, the forward current flowing through the drift region 24 flows through the lower portion of the body region 26 through a narrowed portion (dotted frame portion in FIG. 12) between the first pillar region 32a and the second pillar region 32b adjacent to each other in the first direction. In other words, the path of the forward current is narrowed by the pillar regions 32 adjacent to each other.

In the MOSFET 100, particularly when a high surge voltage is applied, the surge current concentrates on the narrowed portion, so that the temperature of the narrowed portion rises. As the temperature of the narrowed portion rises, the electrical resistance of the narrowed portion increases, so that the forward current flowing through the lower portion of the body region 26 is further suppressed. By further suppressing the forward current flowing through the lower portion of the body region 26, the decrease in the voltage applied to the pn junction is suppressed, and accordingly, the forward voltage (Vf_PN) at which the pn junction diode starts its bipolar operation becomes lower than that in the MOSFET of the comparative example. For example, the forward voltage of the pn junction diode drops from Vf_PN1 to Vf_PN2.

Since the forward voltage of the pn junction diode drops, a large surge current can flow at a low voltage in the MOSFET 100 as compared with the MOSFET of the comparative example. Therefore, for example, considering the case where the allowable loss is the same, the maximum allowable peak current value is a surge current I2, which is larger than the surge current I1. As a result, the surge current withstand capacity of the MOSFET 100 is improved.

From the viewpoint of suppressing an excessive decrease in the forward voltage, it is preferable that the length of the narrowed portion in the second direction is not too large. Therefore, it is preferable that the length of the pillar region 32 in the second direction is smaller than the length of the body region 26 in the second direction. For example, it is preferable that the length (d1 in FIG. 1) of the first pillar region 32a in the second direction is smaller than the length (d2 in FIG. 1) of the first body region 26a in the second direction.

From the viewpoint of effectively concentrating the surge current in the narrowed portion, the depth of the pillar region 32 is preferably equal to or more than 1.5 times the depth of the body region, more preferably equal to or more than 3 times the depth of the body region. For example, the depth (d3 in FIG. 1) of the first pillar region 32a is preferably equal to or more than 1.5 times the depth (d4 in FIG. 1) of the first body region 26a, more preferably equal to or more than 3 times the depth of the first body region 26a.

From the viewpoint of effectively concentrating the surge current in the narrowed portion, it is preferable that the pillar region 32 is close to the JBS region 24c. Therefore, it is preferable that the distance between the pillar region 32 and the JBS region 24c in the second direction is smaller than the distance between the pillar region 32 and the JFET region 24b in the second direction. For example, it is preferable that the distance between the first pillar region 32a and the JBS region 24c in the second direction is smaller than the distance between the first pillar region 32a and the JFET region 24b in the second direction.

From the viewpoint of effectively concentrating the surge current in the narrowed portion, it is preferable that the distance between the two pillar regions 32 adjacent to each other in the first direction is small. For example, it is preferable that the distance between the two pillar regions 32 adjacent to each other in the first direction is equal to or less than the length of the body region 26 in the second direction. For example, it is preferable that the distance (d5 in FIG. 5) between the first pillar region 32a and the second pillar region 32b is equal to or less than the length (d2 in FIG. 1) of the first body region 26a in the second direction.

From the viewpoint of suppressing the decrease in the dielectric breakdown voltage of the MOSFET 100, it is preferable that the p-type impurity concentration in the pillar region 32 is low. Therefore, it is preferable that the p-type impurity concentration in the pillar region 32 is lower than the p-type impurity concentration in the body region 26.

As described above, according to the first embodiment, a MOSFET having an improved surge current withstand capacity is realized by operating the pn junction diode at a low voltage when a surge current flows.

Second Embodiment

A semiconductor device of a second embodiment is different from the semiconductor device of the first embodiment in that the sixth silicon carbide region is provided between the first region and the second region and between the first region and the third silicon carbide region and the seventh silicon carbide region is provided between the first region and the second region and between the first region and the third silicon carbide region. Hereinafter, the description of the content overlapping the first embodiment may be omitted.

Figure 13:
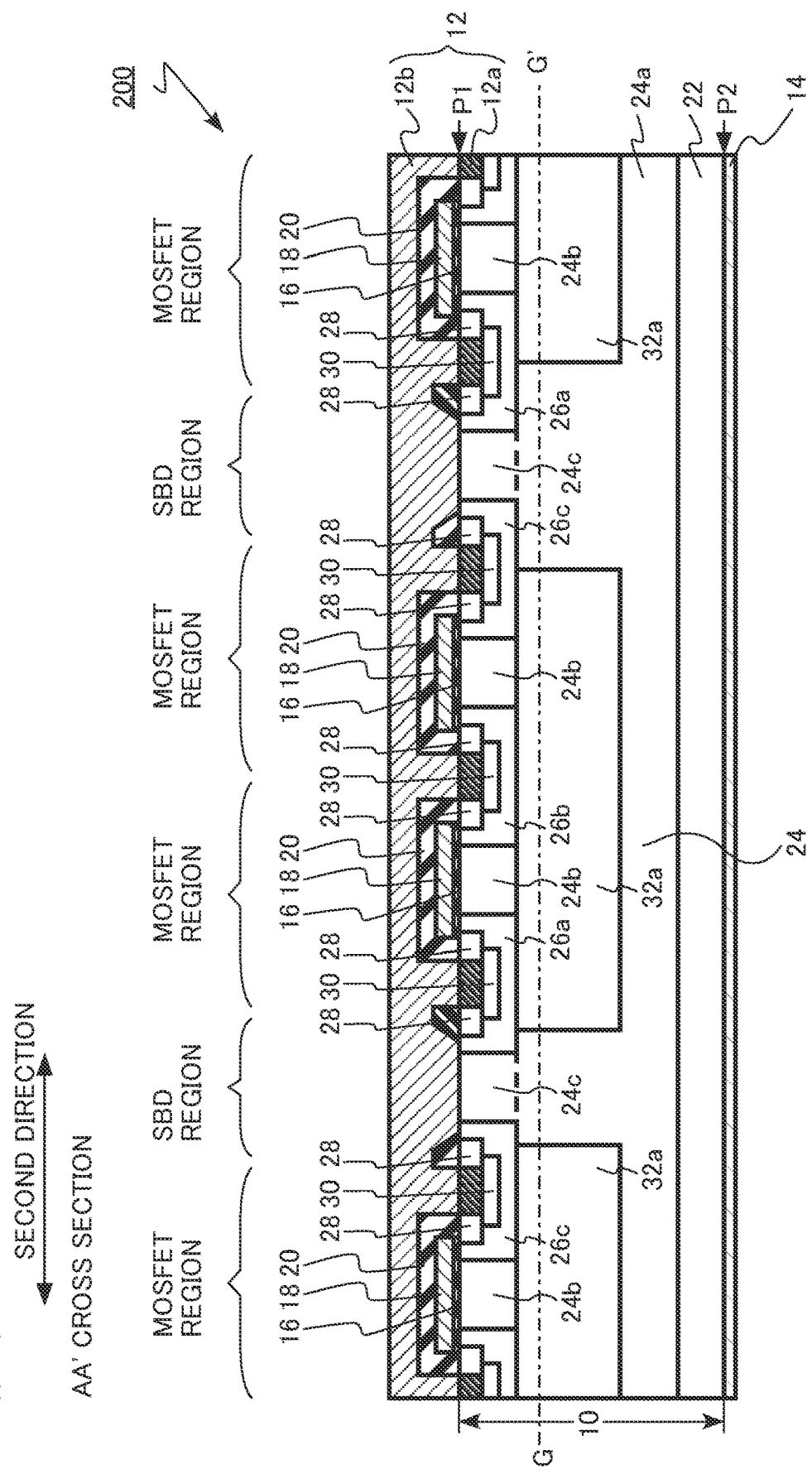
FIG. 13 is a schematic cross-sectional view of a semiconductor device of a second embodiment.
Figure 14:
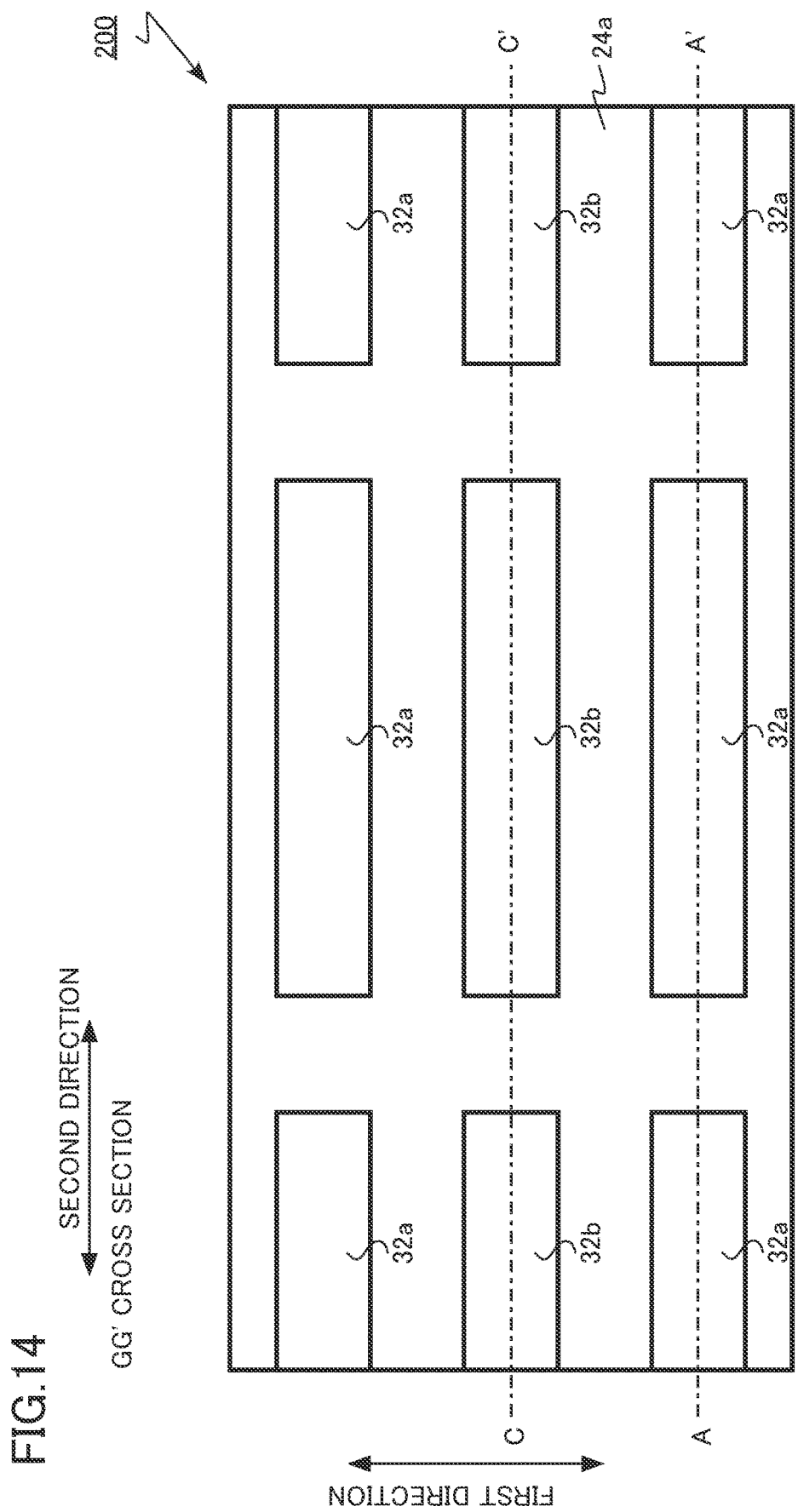
FIG. 14 is a schematic cross-sectional view of the semiconductor device of the second embodiment.
Figure 15:
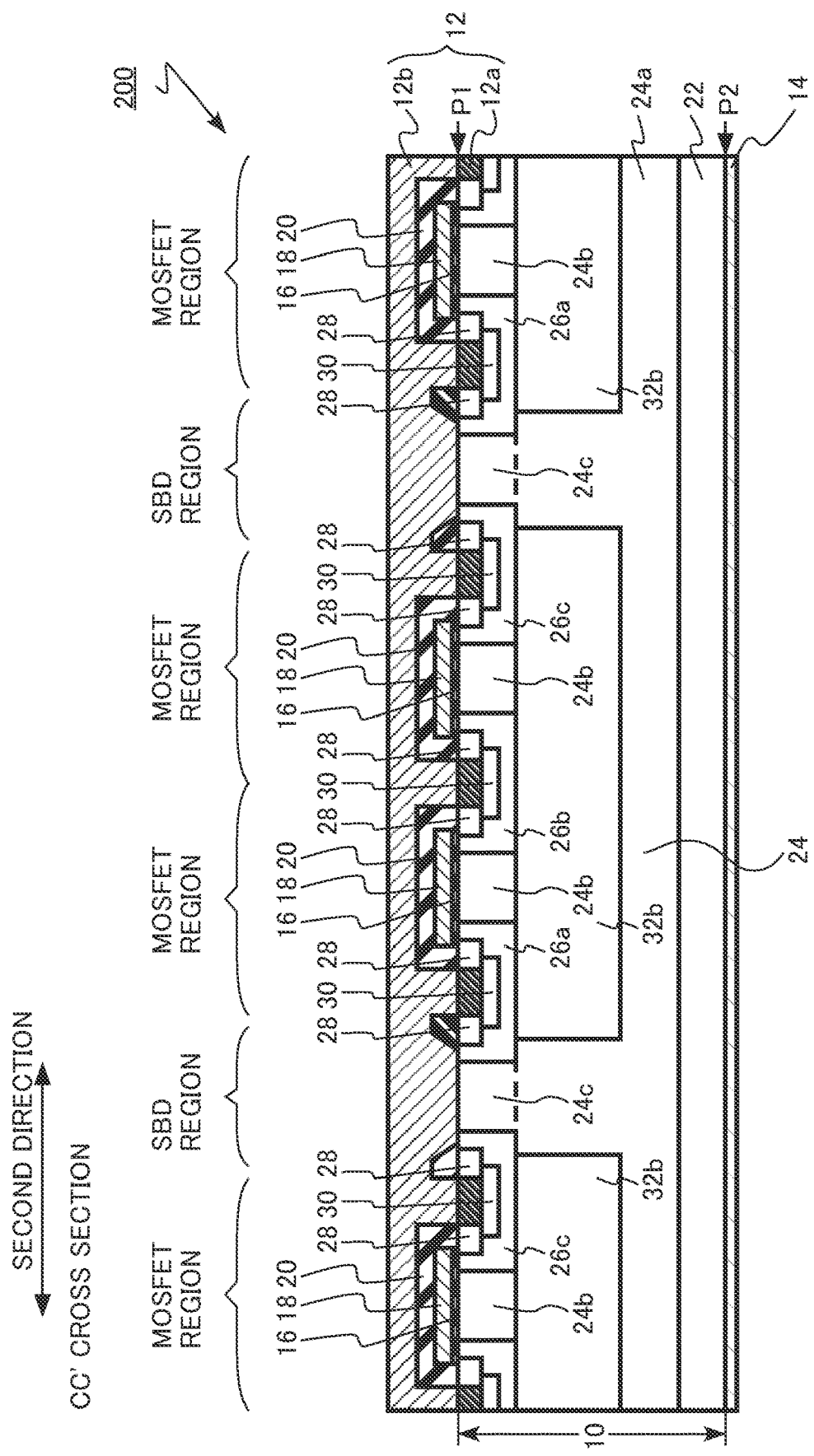
FIG. 15 is a schematic cross-sectional view of the semiconductor device of the second embodiment.

FIGS. 13, 14, and 15 are schematic cross-sectional views of the semiconductor device of the second embodiment. FIG. 13 is a cross-sectional view corresponding to FIG. 1 of the first embodiment. FIG. 13 is a cross-sectional view taken along the line AA' of FIG. 14. FIG. 14 is a cross-sectional view corresponding to FIG. 8 of the first embodiment. FIG. 14 is a cross-sectional view taken along the line GG' of FIG. 13. FIG. 15 is a cross-sectional view corresponding to FIG. 4 of the first embodiment. FIG. 15 is a cross-sectional view taken along the line CC' of FIG. 14.

The semiconductor device of the second embodiment is a planar gate type vertical MOSFET 200 using silicon carbide. The MOSFET 200 of the second embodiment is, for example, a DIMOSFET. In addition, the MOSFET 200 includes an SBD as a built-in diode.

The pillar region 32 is provided between the lower region 24a and the JFET region 24b. The pillar region 32 is provided between the lower region 24a and both of the two body regions 26 adjacent to each other with the JFET region 24b interposed therebetween in the second direction.

For example, the first pillar region 32a is provided between the lower region 24a and the JFET region 24b. In addition, for example, the first pillar region 32a is provided between the lower region 24a and the first body region 26a, and the first pillar region 32a is provided between the lower region 24a and the second body region 26b. The first pillar region 32a is in contact with the first body region 26a and the second body region 26b.

For example, the second pillar region 32b is provided between the lower region 24a and the JFET region 24b. In addition, for example, the second pillar region 32b is provided between the lower region 24a and the first body region 26a, and the second pillar region 32b is provided between the lower region 24a and the second body region 26b. The second pillar region 32b is in contact with the first body region 26a and the second body region 26b.

In the MOSFET 200 of the second embodiment, the length of the pillar region 32 in the second direction increases. Therefore, when a surge voltage is applied, the degree of concentration of the surge current in the narrowed portion becomes larger than that in the MOSFET 100 of the first embodiment. Therefore, the rise in the temperature of the narrowed portion increases, and the increase in the electrical resistance increases. Therefore, the forward current flowing through the lower portion of the body region 26 is further suppressed. Therefore, the forward voltage (Vf_PN) at which the pn junction diode starts its bipolar operation becomes lower than that in the MOSFET 100 of the first embodiment. As a result, the surge current withstand capacity of the MOSFET 200 becomes higher than that of the MOSFET 100 of the first embodiment.

When the MOSFET is in the on state, the load connected to the MOSFET may fail and the load resistance may decrease. In this case, the MOSFET is short-circuited and a large current flows through the MOSFET. The time from when the MOSFET is short-circuited to when the MOSFET is destroyed is referred to as short-circuit tolerance. As the short-circuit tolerance decreases, the reliability of the MOSFET decreases.

In the MOSFET 200 of the second embodiment, the pillar region 32 is provided below the JFET region 24b. Therefore, when the MOSFET 200 is short-circuited, the path of the current flowing through the MOSFET 200 is narrowed between the JFET regions 24b. As a result, when the MOSFET 200 is in a short-circuited state, the current flowing through the MOSFET 200 is suppressed to improve the short-circuit tolerance of the MOSFET 200.

As described above, according to the second embodiment, a MOSFET having an improved surge current withstand capacity is realized by operating the pn junction diode at a low voltage when a surge current flows. In addition, according to the second embodiment, a MOSFET with improved short-circuit tolerance is realized.

Third Embodiment

A semiconductor device of a third embodiment is different from the semiconductor device of the first embodiment in that the sixth silicon carbide region is provided between the first region and the third region and between the first region and the fourth silicon carbide region and the seventh silicon carbide region is provided between the first region and the third region and between the first region and the fourth silicon carbide region. Hereinafter, the description of the content overlapping the first embodiment may be omitted.

Figure 16:
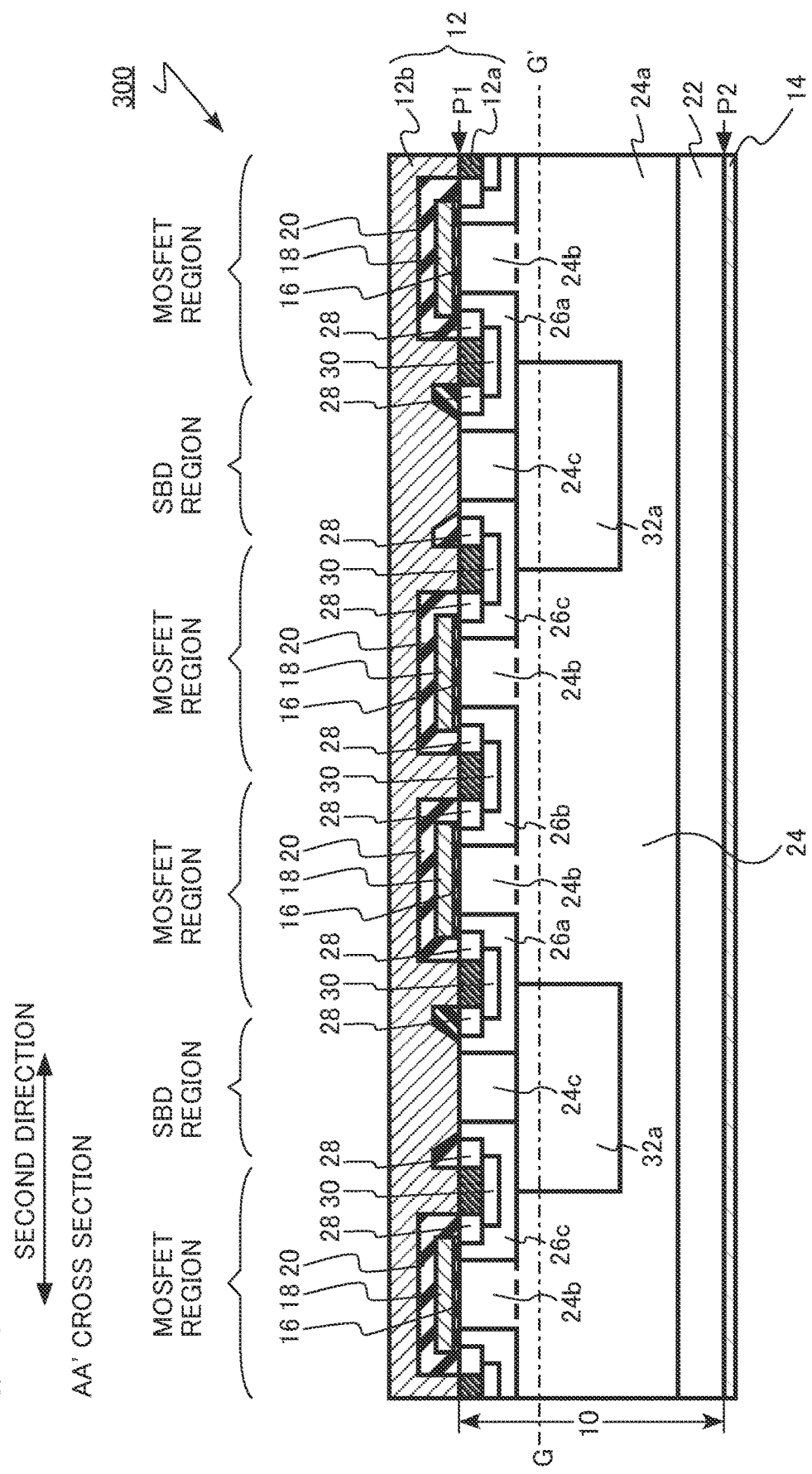
FIG. 16 is a schematic cross-sectional view of a semiconductor device of a third embodiment.
Figure 17:
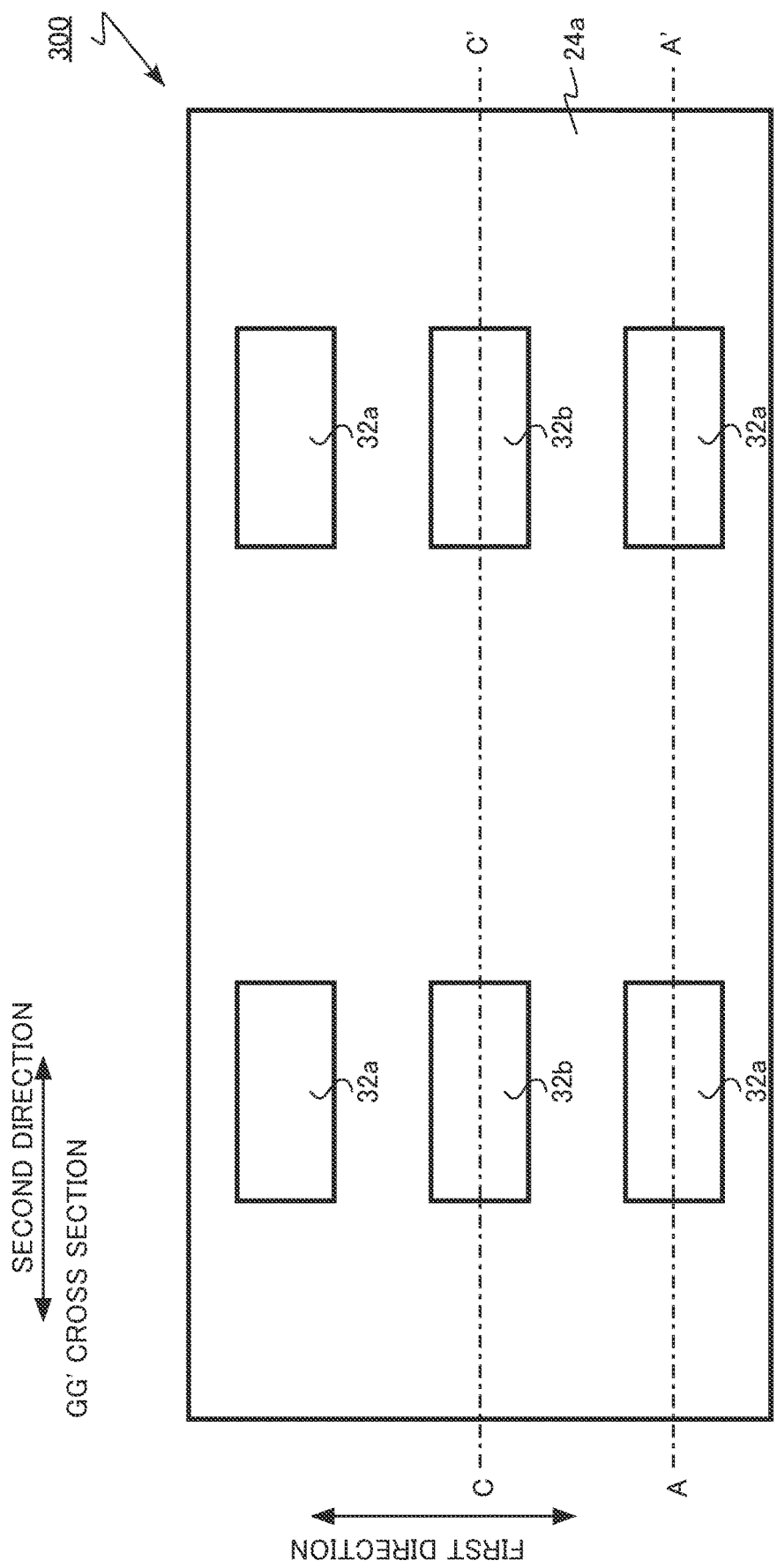
FIG. 17 is a schematic cross-sectional view of the semiconductor device of the third embodiment.
Figure 18:
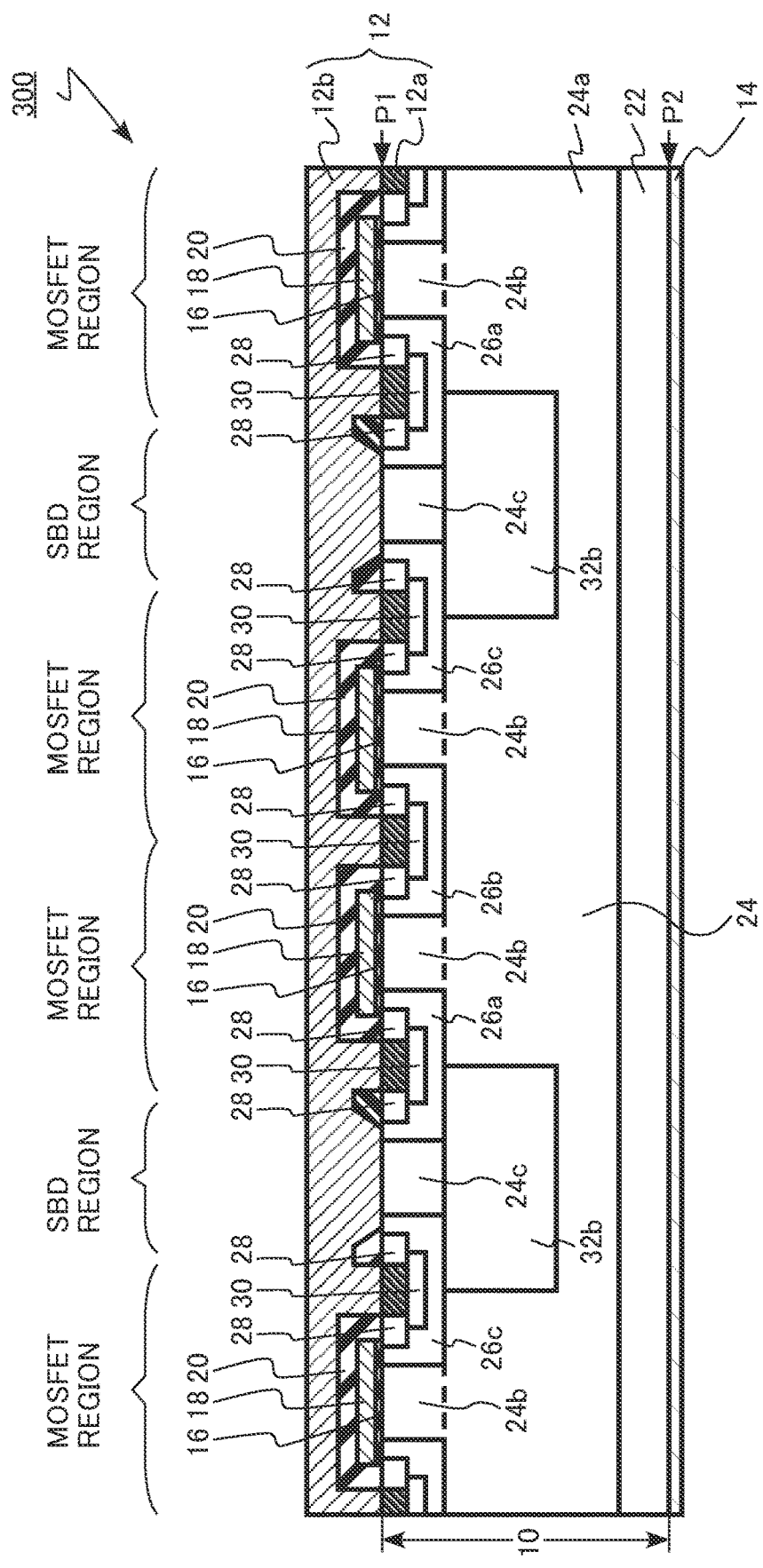
FIG. 18 is a schematic cross-sectional view of the semiconductor device of the third embodiment.

FIGS. 16, 17, and 18 are schematic cross-sectional views of the semiconductor device of the third embodiment.

FIG. 16 is a cross-sectional view corresponding to FIG. 1 of the first embodiment. FIG. 16 is a cross-sectional view taken along the line AA' of FIG. 17. FIG. 17 is a cross-sectional view corresponding to FIG. 8 of the first embodiment. FIG. 17 is a cross-sectional view taken along the line GG' of FIG. 16. FIG. 18 is a cross-sectional view corresponding to FIG. 4 of the first embodiment. FIG. 18 is a cross-sectional view taken along the line CC' of FIG. 17.

The semiconductor device of the third embodiment is a planar gate type vertical MOSFET 300 using silicon carbide. The MOSFET 300 of the third embodiment is, for example, a DIMOSFET. In addition, the MOSFET 300 includes an SBD as a built-in diode.

The pillar region 32 is provided between the lower region 24a and the JBS region 24c. The pillar region 32 is provided between the lower region 24a and both of the two body regions 26 adjacent to each other with the JBS region 24c interposed therebetween in the second direction.

For example, the first pillar region 32a is provided between the lower region 24a and the JBS region 24c. In addition, for example, the first pillar region 32a is provided between the lower region 24a and the first body region 26a, and the first pillar region 32a is provided between the lower region 24a and the third body region 26c. The first pillar region 32a is in contact with the first body region 26a and the third body region 26c.

For example, the second pillar region 32b is provided between the lower region 24a and the JBS region 24c. In addition, for example, the second pillar region 32b is provided between the lower region 24a and the first body region 26a, and the second pillar region 32b is provided between the lower region 24a and the third body region 26c. The second pillar region 32b is in contact with the first body region 26a and the third body region 26c.

In the MOSFET 300 of the third embodiment, the pillar region 32 is also provided below the JBS region 24c. Therefore, when a surge voltage is applied, the path of the surge current flowing from the JBS region 24c to the lower region 24a is narrowed. Therefore, when a surge voltage is applied, the degree of concentration of the surge current in the narrowed portion becomes larger than that in the MOSFET 100 of the first embodiment. Therefore, the rise in the temperature of the narrowed portion increases, and the increase in the electrical resistance increases. Therefore, the forward current flowing through the lower portion of the body region 26 is further suppressed. Therefore, the forward voltage (Vf_PN) at which the pn junction diode starts its bipolar operation becomes lower than that in the MOSFET 100 of the first embodiment. As a result, the surge current withstand capacity of the MOSFET 300 becomes higher than that of the MOSFET 100 of the first embodiment.

As described above, according to the third embodiment, a MOSFET having an improved surge current withstand capacity is realized by operating the pn junction diode at a low voltage when a surge current flows.

Fourth Embodiment

A semiconductor device of a fourth embodiment is different from the semiconductor device of the first embodiment in that the sixth silicon carbide region is provided between the first region and the second region and between the first region and the third silicon carbide region and the seventh silicon carbide region is provided between the first region and the second region and between the first region and the third silicon carbide region. In addition, the semiconductor device of the fourth embodiment is different from the semiconductor device of the first embodiment in that the sixth silicon carbide region is provided between the first region and the third region and between the first region and the fourth silicon carbide region and the seventh silicon carbide region is provided between the first region and the third region and between the first region and the fourth silicon carbide region. Hereinafter, the description of the content overlapping the first embodiment may be omitted.

Figure 19:
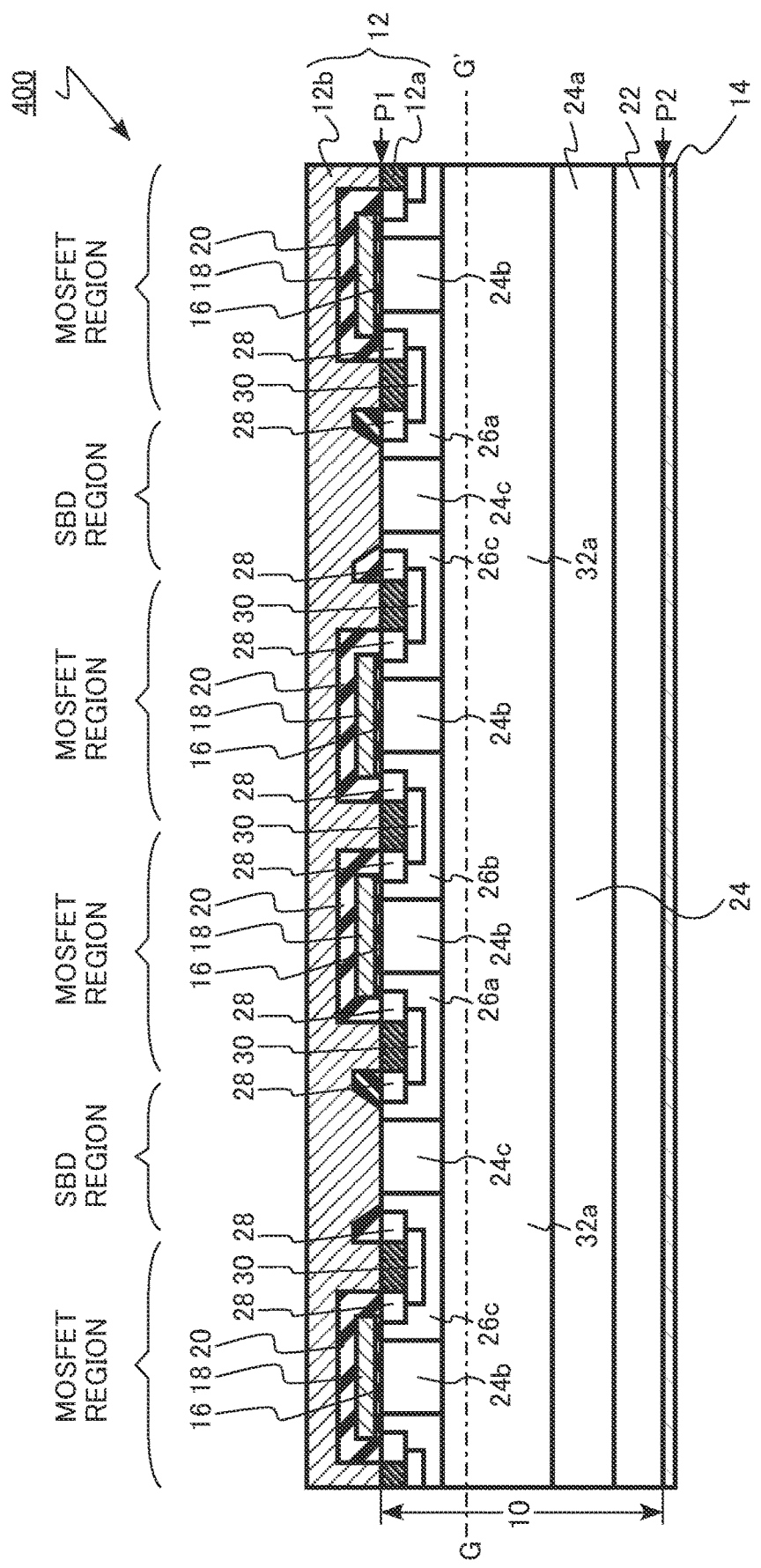
FIG. 19 is a schematic cross-sectional view of a semiconductor device of a fourth embodiment.
Figure 20:
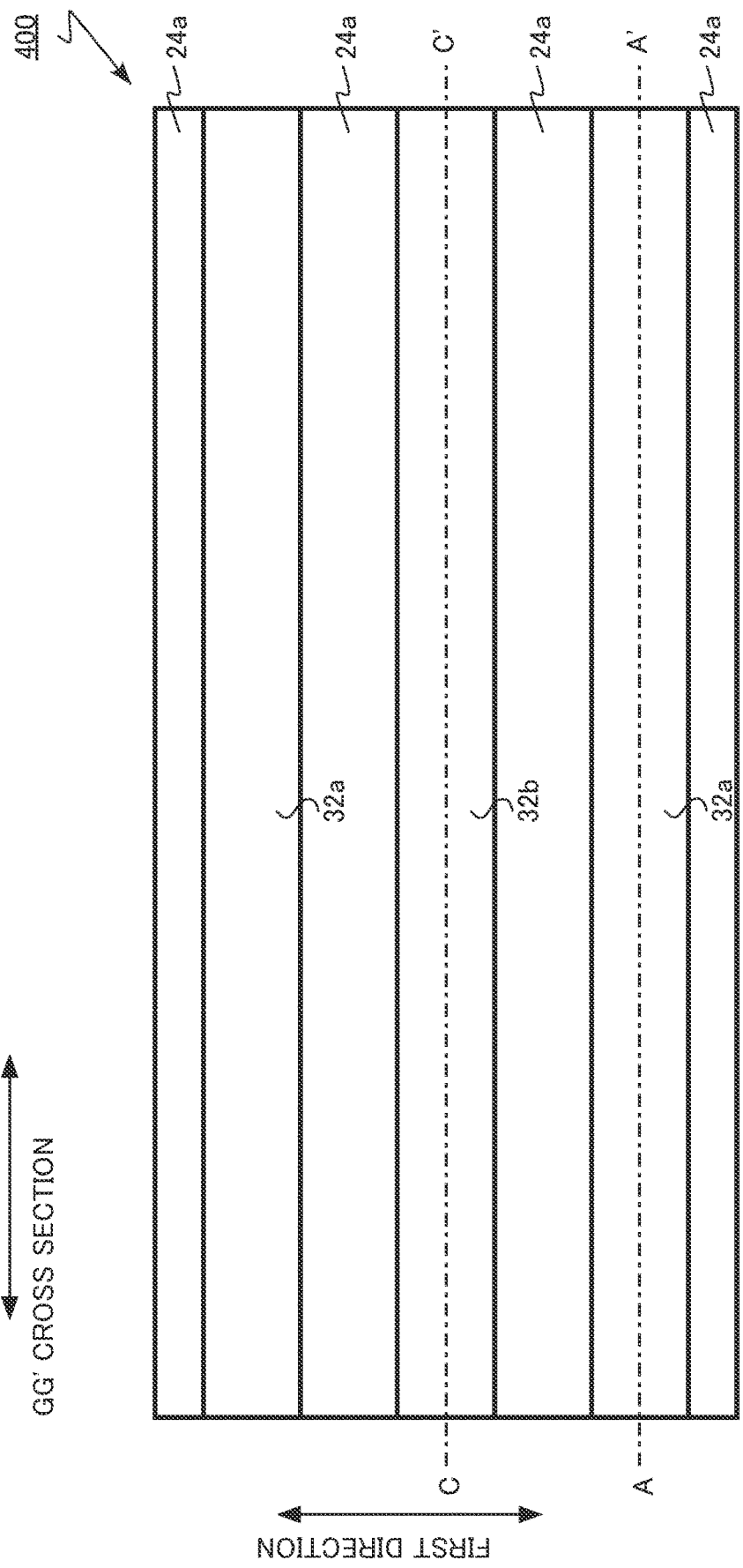
FIG. 20 is a schematic cross-sectional view of the semiconductor device of the fourth embodiment.
Figure 21:
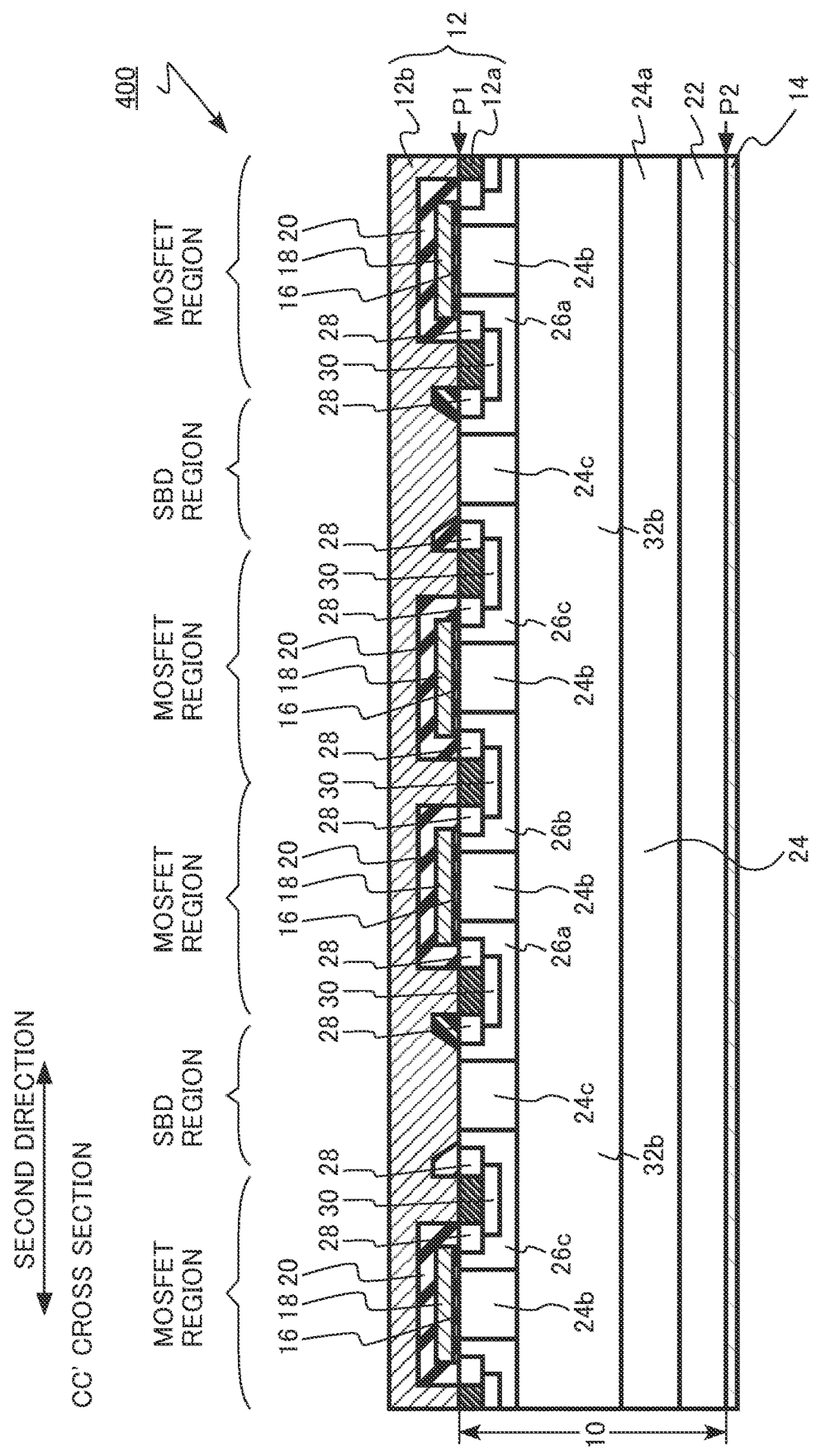
FIG. 21 is a schematic cross-sectional view of the semiconductor device of the fourth embodiment.

FIGS. 19, 20, and 21 are schematic cross-sectional views of the semiconductor device of the fourth embodiment.

FIG. 19 is a cross-sectional view corresponding to FIG. 1 of the first embodiment. FIG. 19 is a cross-sectional view taken along the line AA' of FIG. 20. FIG. 20 is a cross-sectional view corresponding to FIG. 8 of the first embodiment. FIG. 20 is a cross-sectional view taken along the line GG' of FIG. 19. FIG. 21 is a cross-sectional view corresponding to FIG. 4 of the first embodiment. FIG. 21 is a cross-sectional view taken along the line CC' of FIG. 20.

The semiconductor device of the fourth embodiment is a planar gate type vertical MOSFET 400 using silicon carbide. The MOSFET 400 of the fourth embodiment is, for example, a DIMOSFET. In addition, the MOSFET 400 includes an SBD as a built-in diode.

The pillar region 32 is provided between the lower region 24a and the JFET region 24b. The pillar region 32 is provided between the lower region 24a and both of the two body regions 26 adjacent to each other with the JFET region 24b interposed therebetween in the second direction.

For example, the first pillar region 32a is provided between the lower region 24a and the JFET region 24b. In addition, for example, the first pillar region 32a is provided between the lower region 24a and the first body region 26a, and the first pillar region 32a is provided between the lower region 24a and the second body region 26b. The first pillar region 32a is in contact with the first body region 26a and the second body region 26b.

For example, the second pillar region 32b is provided between the lower region 24a and the JFET region 24b. In addition, for example, the second pillar region 32b is provided between the lower region 24a and the first body region 26a, and the second pillar region 32b is provided between the lower region 24a and the second body region 26b. The second pillar region 32b is in contact with the first body region 26a and the second body region 26b.

In addition, the pillar region 32 is provided between the lower region 24a and the JBS region 24c. The pillar region 32 is provided between the lower region 24a and both of the two body regions 26 adjacent to each other with the JBS region 24c interposed therebetween in the second direction.

For example, the first pillar region 32a is provided between the lower region 24a and the JBS region 24c. In addition, for example, the first pillar region 32a is provided between the lower region 24a and the first body region 26a, and the first pillar region 32a is provided between the lower region 24a and the third body region 26c. The first pillar region 32a is in contact with the first body region 26a and the third body region 26c.

For example, the second pillar region 32b is provided between the lower region 24a and the JBS region 24c. In addition, for example, the second pillar region 32b is provided between the lower region 24a and the first body region 26a, and the second pillar region 32b is provided between the lower region 24a and the third body region 26c. The second pillar region 32b is in contact with the first body region 26a and the third body region 26c.

The pillar region 32 extends in the second direction. The pillar region 32 is provided so as to cross the body region 26 extending in the first direction.

In the MOSFET 400 of the fourth embodiment, the path of the surge current flowing from the JBS region 24c to the lower region 24a is further narrowed as compared with the MOSFET 100 of the first embodiment. Therefore, the surge current withstand capacity of the MOSFET 400 is higher than that of the MOSFET 100 of the first embodiment.

In addition, as in the MOSFET 200 of the second embodiment, when the MOSFET 400 is short-circuited, the current flowing through the MOSFET 400 is suppressed. Therefore, the short-circuit tolerance of the MOSFET 400 is improved.

As described above, according to the fourth embodiment, a MOSFET having an improved surge current withstand capacity is realized by operating the pn junction diode at a low voltage when a surge current flows. In addition, according to the fourth embodiment, a MOSFET with improved short-circuit tolerance is realized.

Fifth Embodiment

A semiconductor device of a fifth embodiment is different from the semiconductor device of the first embodiment in that the first silicon carbide region is provided between the first region and the second silicon carbide region and between the sixth silicon carbide region and the seventh silicon carbide region and further has a fourth region having a first conductive type impurity concentration higher than the first region. Hereinafter, the description of the content overlapping the first embodiment may be omitted.

Figure 22:
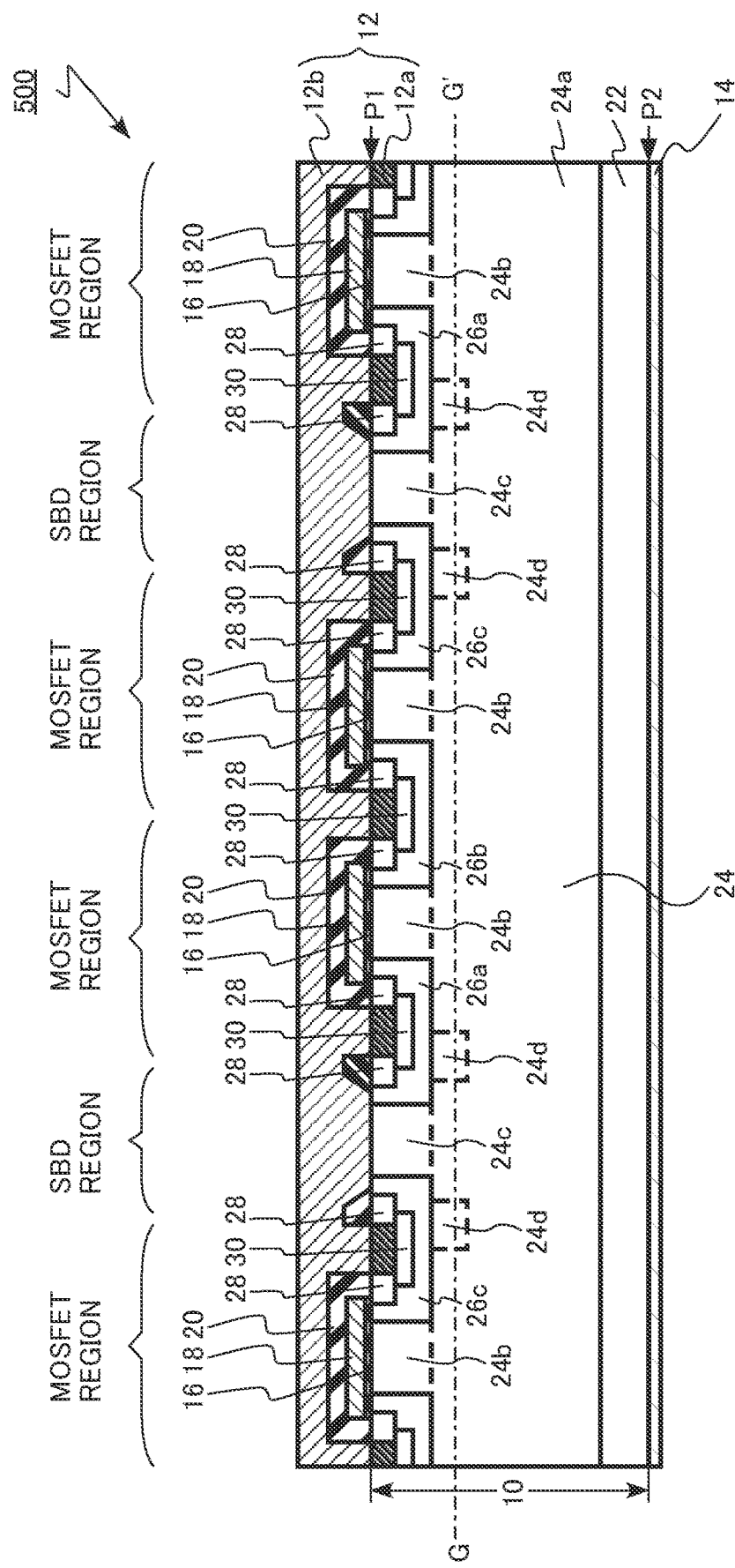
FIG. 22 is a schematic cross-sectional view of a semiconductor device of a fifth embodiment.
Figure 23:
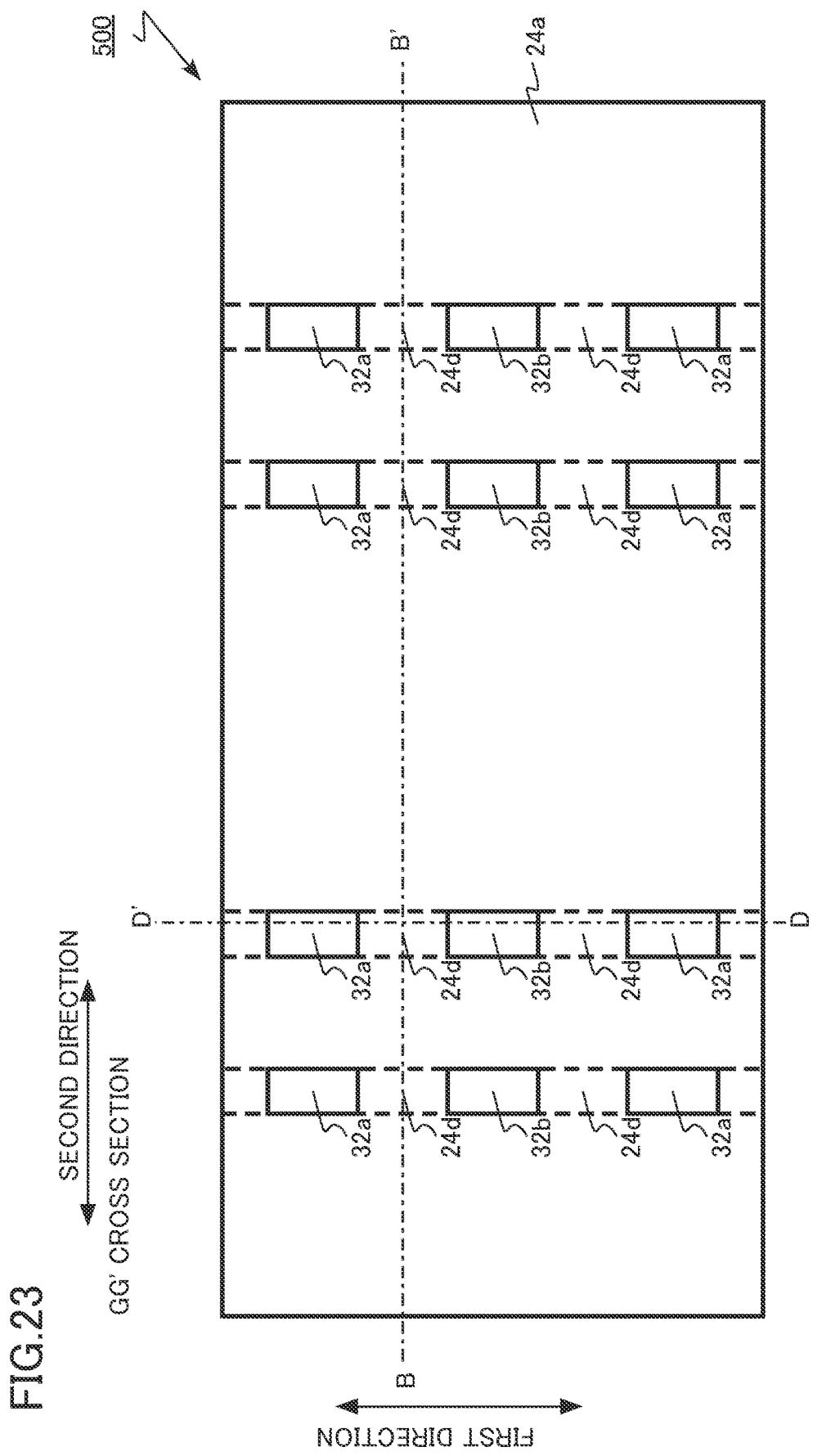
FIG. 23 is a schematic cross-sectional view of the semiconductor device of the fifth embodiment.
Figure 24:
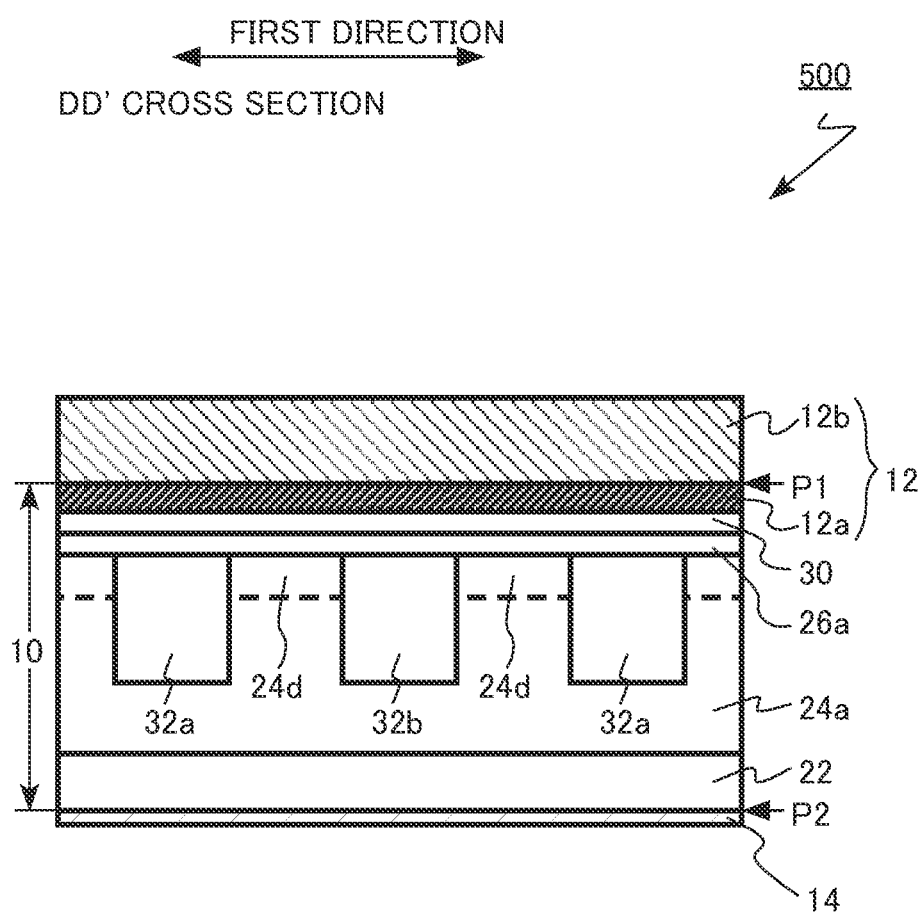
FIG. 24 is a schematic cross-sectional view of the semiconductor device of the fifth embodiment.

FIGS. 22, 23, and 24 are schematic cross-sectional views of the semiconductor device of the fifth embodiment.

FIG. 22 is a cross-sectional view corresponding to FIG. 3 of the first embodiment. FIG. 22 is a cross-sectional view taken along the line BB' of FIG. 23. FIG. 23 is a cross-sectional view corresponding to FIG. 8 of the first embodiment. FIG. 23 is a cross-sectional view taken along the line GG' of FIG. 22. FIG. 24 is a cross-sectional view corresponding to FIG. 5 of the first embodiment. FIG. 24 is a cross-sectional view taken along the line DD' of FIG. 23.

The semiconductor device of the fifth embodiment is a planar gate type vertical MOSFET 500 using silicon carbide. The MOSFET 500 of the fifth embodiment is, for example, a DIMOSFET. In addition, the MOSFET 500 includes an SBD as a built-in diode.

The n⁻-type drift region 24 has a lower region 24a, a JFET region 24b, a JBS region 24c, and a high concentration region 24d.

The high concentration region 24d is provided between the lower region 24a and the body region 26. In addition, the high concentration region 24d is provided between two pillar regions 32 adjacent to each other in the first direction. The high concentration region 24d is in contact with, for example, the body region 26.

The high concentration region 24d is provided, for example, between the lower region 24a and the first body region 26a. In addition, the high concentration region 24d is provided, for example, between the first pillar region 32a and the second pillar region 32b. The high concentration region 24d is in contact with, for example, the first body region 26a.

In the MOSFET 500 of the fifth embodiment, since the high concentration region 24d is provided between the two pillar regions 32 adjacent to each other in the first direction, the electric resistance of a narrowed portion between the two pillar regions 32 is lower than that in the MOSFET 100 of the first embodiment. Therefore, it is possible to increase the forward current when the reflux current flows. As a result, it is possible to further suppress the operation of the pn junction diode in the steady state. In other words, it is possible to increase the forward voltage (Vf_PN) in the steady state.

Modification Example

Figure 25:
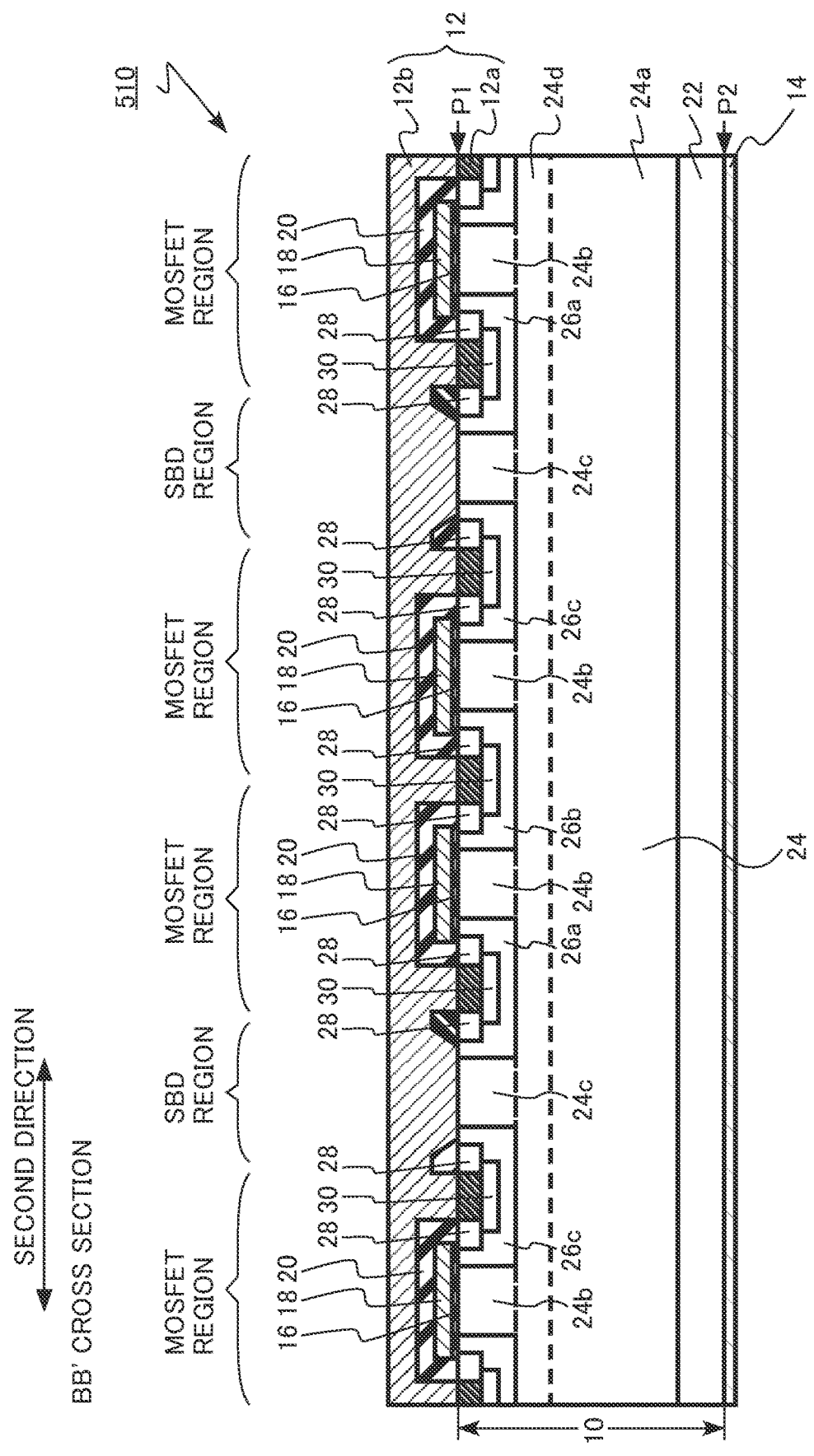
FIG. 25 is a schematic cross-sectional view of a semiconductor device of a modification example of the fifth embodiment.

FIG. 25 is a schematic cross-sectional view of a semiconductor device of a modification example of the fifth embodiment. FIG. 25 is a cross-sectional view corresponding to FIG. 22.

The semiconductor device of the modification example of the fifth embodiment is a MOSFET 510. The MOSFET 510 is different from the MOSFET 500 in that the high concentration region 24d is provided between the lower region 24a and the JFET region 24b and between the lower region 24a and the JBS region 24c.

The high concentration region 24d extends in the second direction. The high concentration region 24d is in contact with, for example, the first body region 26a, the second body region 26b, and the third body region 26c. The high concentration region 24d has a striped shape.

According to the MOSFET 510, the electrical resistance of a portion close to the body region 26 is lower than that in the MOSFET 500. Therefore, it is possible to further increase the forward current when the reflux current flows in the steady state. As a result, it is possible to further suppress the operation of the pn junction diode in the steady state.

In addition, it is also possible to form the high concentration region 24d having a striped shape into a two-dimensional shape in which the n-type impurity concentration between the stripes is high.

As described above, according to the fifth embodiment and the modification example, a MOSFET having an improved surge current withstand capacity is realized by operating the pn junction diode at a low voltage when a surge current flows.

Sixth Embodiment

A semiconductor device of a sixth embodiment is different from the semiconductor device of the first embodiment in that the eighth silicon carbide region is provided in the first direction of the third region. Hereinafter, the description of the content overlapping the first embodiment may be omitted.

Figure 26:
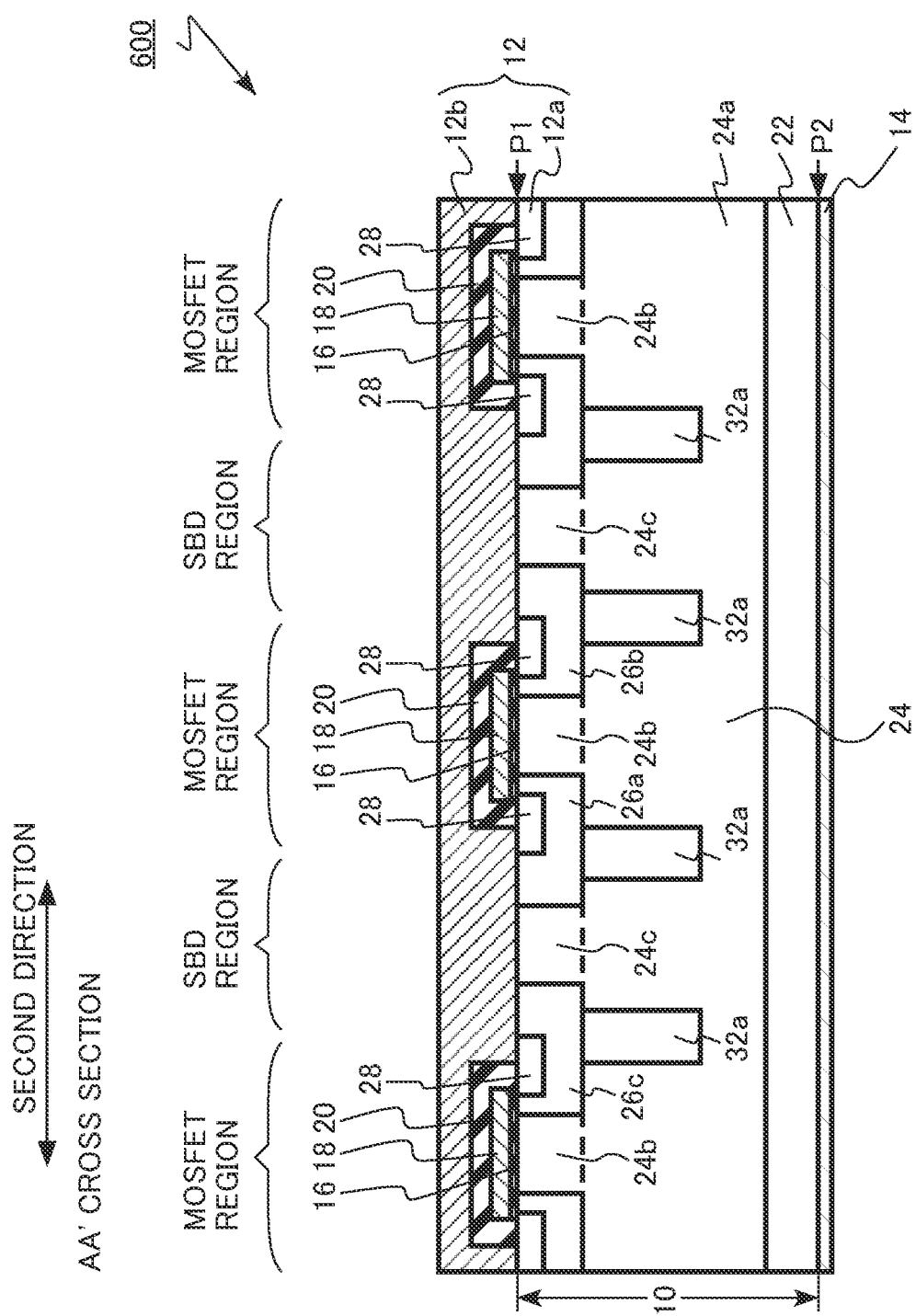
FIG. 26 is a schematic cross-sectional view of a semiconductor device of a sixth embodiment.
Figure 27:
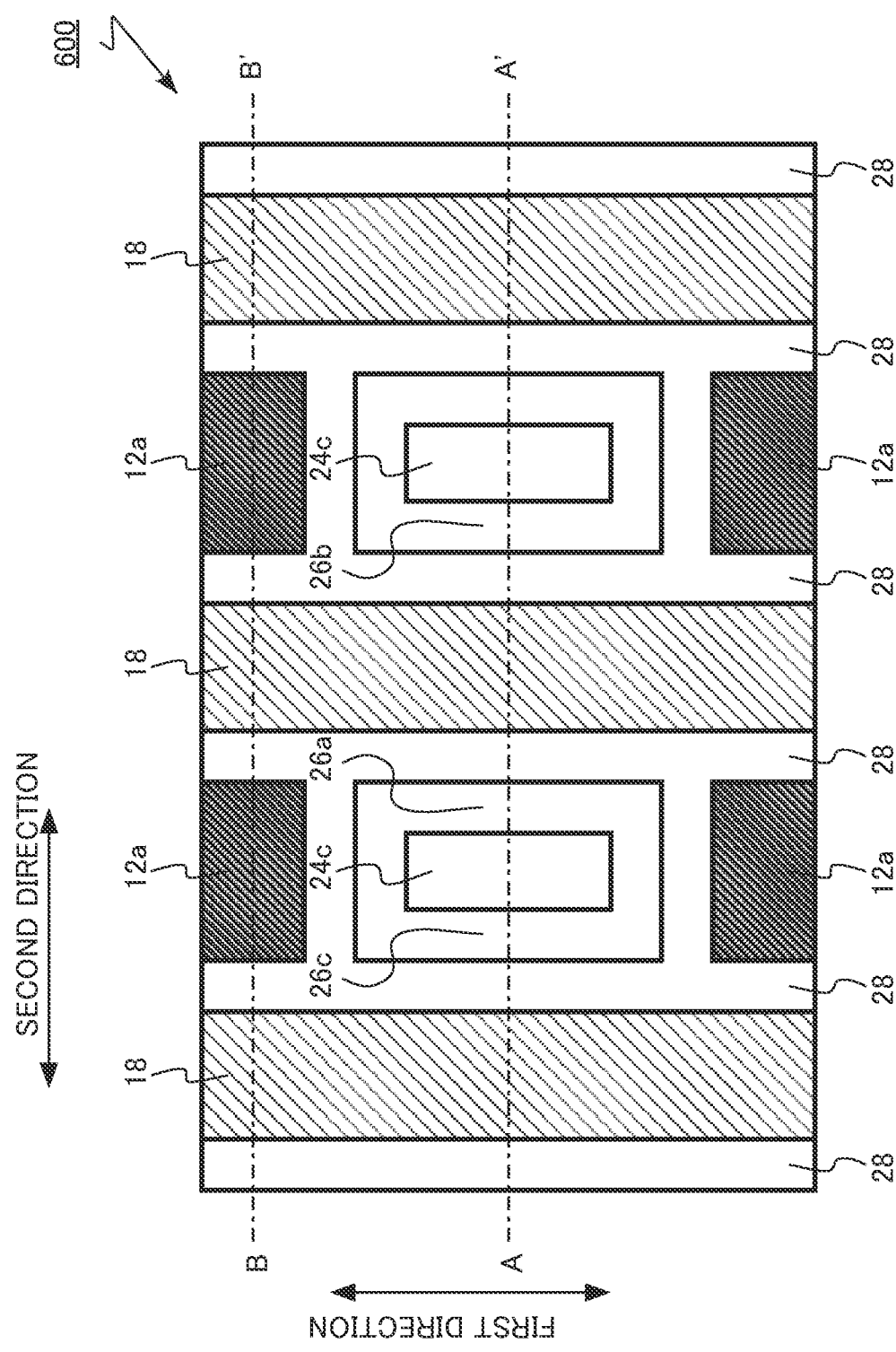
FIG. 27 is a schematic top view of the semiconductor device of the sixth embodiment.
Figure 28:
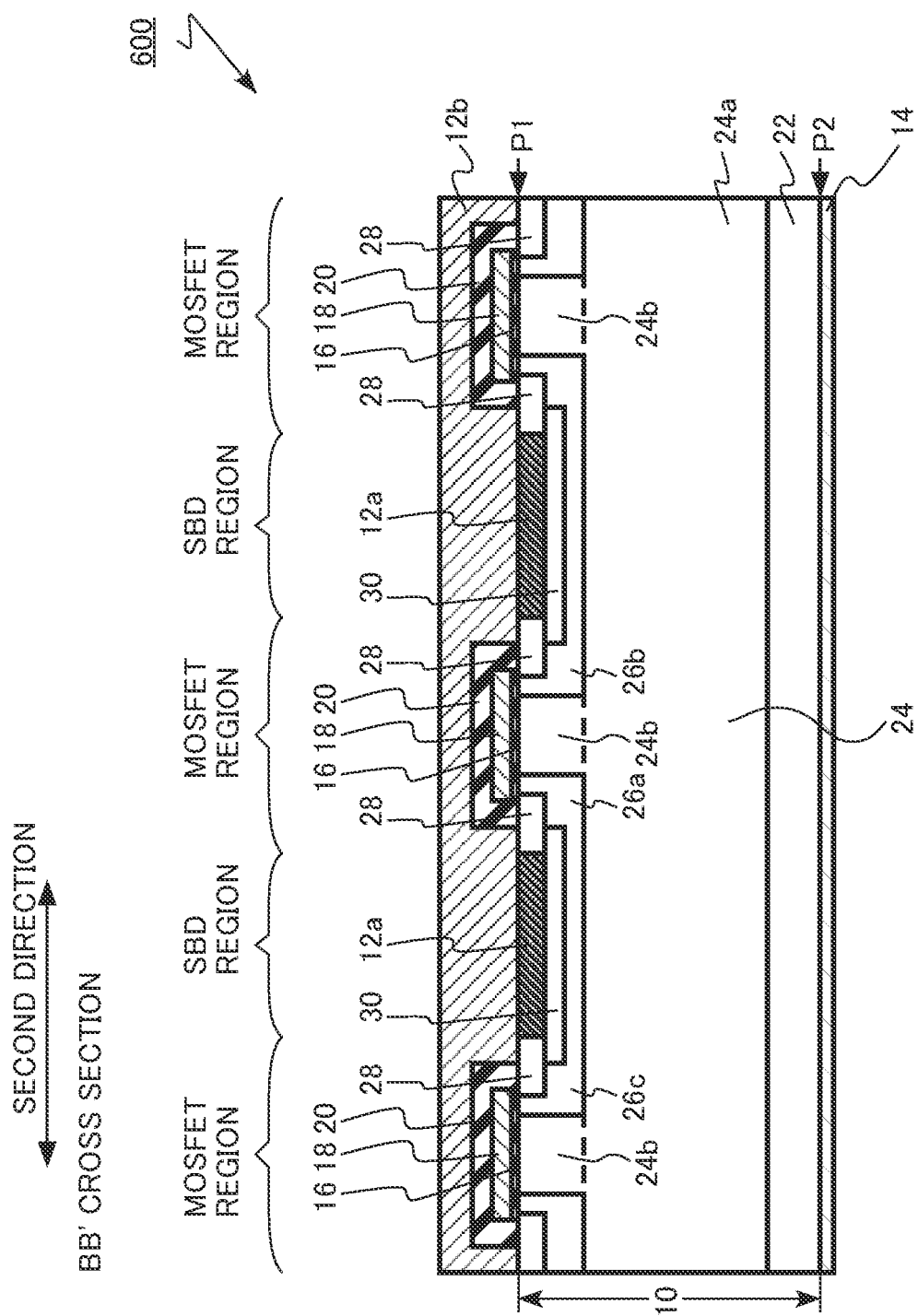
FIG. 28 is a schematic cross-sectional view of the semiconductor device of the sixth embodiment.

FIG. 26 is a schematic cross-sectional view of the semiconductor device of the sixth embodiment. FIG. 27 is a schematic top view of the semiconductor device of the sixth embodiment. FIG. 28 is a schematic cross-sectional view of the semiconductor device of the sixth embodiment.

FIG. 26 is a cross-sectional view corresponding to FIG. 1 of the first embodiment. FIG. 26 is a cross-sectional view taken along the line AA' of FIG. 27. FIG. 27 is a cross-sectional view corresponding to FIG. 2 of the first embodiment. FIG. 27 is a diagram showing a layout pattern of silicon carbide regions and electrodes on the surface of a silicon carbide layer. FIG. 27 shows a state in which a first electrode and an interlayer insulating layer are removed. FIG. 28 is a cross-sectional view corresponding to FIG. 3 of the first embodiment. FIG. 28 is a cross-sectional view taken along the line BB' of FIG. 27.

The semiconductor device of the sixth embodiment is a planar gate type vertical MOSFET 600 using silicon carbide. The MOSFET 600 of the sixth embodiment is, for example, a DIMOSFET. In addition, the MOSFET 600 of the sixth embodiment includes an SBD as a built-in diode.

Hereinafter, a case where the first conductive type is n-type and the second conductive type is p-type will be described as an example. The MOSFET 600 is a vertical re-channel MOSFET having electrons as carriers.

The MOSFET 600 includes a silicon carbide layer 10, a source electrode 12 (first electrode), a drain electrode 14 (second electrode), a gate insulating layer 16, a gate electrode 18, and an interlayer insulating layer 20. The MOSFET 600 includes a plurality of MOSFET regions and a plurality of SBD regions.

The silicon carbide layer 10 includes an n$^+$-type drain region 22, an n$^-$-type drift region 24 (first silicon carbide region), a p-type body region 26, an n$^+$-type source region 28 (fifth silicon carbide region), a p$^+$-type body contact region 30 (eighth silicon carbide region), and a p-type pillar region 32.

The p-type body region 26 includes a first body region of p-type 26a (second silicon carbide region), a second body region of p-type 26b (third silicon carbide region), and a third body region of p-type 26c (fourth silicon carbide region). The p-type pillar region 32 includes a first pillar region of p-type 32a (sixth silicon carbide region) and a second pillar region of p-type 32b (seventh silicon carbide region). The drift region 24 has a lower region 24a, a JFET region 24b (first region), and a JBS region 24c (second region).

The source electrode 12 is an example of the first electrode. The drain electrode 14 is an example of the second electrode. The drift region 24 is an example of the first silicon carbide region. The first body region 26a is an example of the second silicon carbide region. The second body region 26b is an example of the third silicon carbide region. The third body region 26c is an example of the fourth silicon carbide region. The source region 28 is an example of the fifth silicon carbide region. The first pillar region 32a is an example of the sixth silicon carbide region. The second pillar region 32b is an example of the seventh silicon carbide region. The body contact region 30 is an example of the eighth silicon carbide region.

In the MOSFET 600, the body contact region 30 is provided in the first direction of the JBS region 24c. The body contact region 30 is interposed between the two JBS regions 24c adjacent to each other in the first direction.

In the MOSFET 600, the JBS region 24c is provided in the first direction of the body contact region 30. The JBS region 24c is interposed between the two body contact regions 30 adjacent to each other in the first direction.

In the MOSFET 600, the silicide layer 12a is provided in the first direction of the JBS region 24c. The silicide layer 12a is interposed between the two JBS regions 24c adjacent to each other in the first direction.

In the MOSFET 600, the JBS region 24c is provided in the first direction of the silicide layer 12a. The JBS region 24c is interposed between the two silicide layers 12a adjacent to each other in the first direction.

In the MOSFET 600, the path of the forward current is narrowed by the pillar regions 32 adjacent to each other. Therefore, the surge current withstand capacity is improved as in the MOSFET 100 of the first embodiment.

As described above, according to the sixth embodiment, a MOSFET having an improved surge current withstand capacity is realized by operating the pn junction diode at a low voltage when a surge current flows.

In the first to sixth embodiments, the case of 4H—SiC has been described as an example of the crystal structure of SiC. However, embodiments can also be applied to devices using SiC having other crystal structures, such as 6H—SiC and 3C—SiC. In addition, a face other than the (0001) face can also be applied as the surface of the silicon carbide layer 10.

In the first to sixth embodiments, the case where the first conductive type is n-type and the second conductive type is p-type has been described as an example. However, the first conductive type can be p-type and the second conductive type can be n-type.

In the first to sixth embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
a gate electrode extending in a first direction;
a silicon carbide layer provided between the first electrode and the second electrode, having a first face parallel to the first direction on a side of the first electrode and a second face on a side of the second electrode, and including:
a first silicon carbide region of a first conductive type having a first region, a second region and a third region, the second region provided between the first region and the first face, the second region being in contact with the first face, the second region facing the gate electrode, the third region provided between the first region and the first face, the third region being in contact with the first face, and the third region being in contact with the first electrode;
a second silicon carbide region of a second conductive type provided between the first region and the first face, the second silicon carbide region disposed between the second region and the third region, the second silicon carbide region facing the gate electrode, and the second silicon carbide region electrically connected to the first electrode;
a third silicon carbide region of a second conductive type provided between the first region and the first face, the third silicon carbide region facing the gate electrode, and the third silicon carbide region electrically connected to the first electrode, the second region being disposed between the second silicon carbide region and the third silicon carbide region;
a fourth silicon carbide region of a second conductive type provided between the first region and the first face and electrically connected to the first electrode, the third region being disposed between the second silicon carbide region and the fourth silicon carbide region;
a fifth silicon carbide region of a first conductive type provided between the second silicon carbide region and the first face and electrically connected to the first electrode;
a sixth silicon carbide region of a second conductive type provided between the first region and the second silicon carbide region; and
a seventh silicon carbide region of a second conductive type provided between the first region and the second silicon carbide region, and the seventh silicon carbide region being separated from the sixth silicon carbide region in the first direction; and a gate insulating layer provided between the gate electrode and the second silicon carbide region, the gate insulating layer provided between the gate electrode and the third silicon carbide region, and the gate insulating layer provided between the gate electrode and the second region.

2. The semiconductor device according to claim 1, wherein the sixth silicon carbide region is in contact with the second silicon carbide region, and the seventh silicon carbide region is in contact with the second silicon carbide region.

3. The semiconductor device according to claim 1, wherein a length of the sixth silicon carbide region in a second direction parallel to the first face and perpendicular to the first direction is smaller than a length of the second silicon carbide region in the second direction, and a length of the seventh silicon carbide region in the second direction is smaller than a length of the second silicon carbide region in the second direction.

4. The semiconductor device according to claim 1, wherein the sixth silicon carbide region is provided between the first region and the second region and between the first region and the third silicon carbide region, and the seventh silicon carbide region is provided between the first region and the second region and between the first region and the third silicon carbide region.

5. The semiconductor device according to claim 4, wherein the sixth silicon carbide region is in contact with the third silicon carbide region, and the seventh silicon carbide region is in contact with the third silicon carbide region.

6. The semiconductor device according to claim 1, wherein the sixth silicon carbide region is provided between the first region and the third region and between the first region and the fourth silicon carbide region, and the seventh silicon carbide region is provided between the first region and the third region and between the first region and the fourth silicon carbide region.

7. The semiconductor device according to claim 6, wherein the sixth silicon carbide region is in contact with the fourth silicon carbide region, and the seventh silicon carbide region is in contact with the fourth silicon carbide region.

8. The semiconductor device according to claim 1, wherein the first silicon carbide region further includes a fourth region having a first conductive type impurity concentration higher than the first region, the fourth region is provided between the first region and the second silicon carbide region and between the sixth silicon carbide region and the seventh silicon carbide region.

9. The semiconductor device according to claim 1, wherein a depth of the sixth silicon carbide region and a depth of the seventh silicon carbide region are equal to or more than twice a depth of the second silicon carbide region.

10. The semiconductor device according to claim 1, wherein a distance between the sixth silicon carbide region and the seventh silicon carbide region in the first direction is equal to or less than a length of the second silicon carbide region in a second direction parallel to the first face and perpendicular to the first direction.

\* \* \* \* \*